(12) United States Patent
Takuma et al.

(10) Patent No.: US 11,949,048 B2
(45) Date of Patent: Apr. 2, 2024

(54) ILLUMINATION DEVICE AND DISPLAY DEVICE

(71) Applicant: Japan Display Inc., Tokyo (JP)

(72) Inventors: Masaaki Takuma, Tokyo (JP); Mao Izawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 559 days.

(21) Appl. No.: 17/212,133

(22) Filed: Mar. 25, 2021

(65) Prior Publication Data

US 2021/0305466 A1    Sep. 30, 2021

(30) Foreign Application Priority Data

Mar. 25, 2020    (JP) .................................. 2020-054360

(51) Int. Cl.
| | |
|---|---|
| *H01L 33/48* | (2010.01) |
| *F21S 2/00* | (2016.01) |
| *G02F 1/1335* | (2006.01) |
| *G02F 1/13357* | (2006.01) |
| *H01L 25/075* | (2006.01) |
| *H01L 27/15* | (2006.01) |
| *H01L 33/56* | (2010.01) |

(Continued)

(52) U.S. Cl.
CPC .......... *H01L 33/486* (2013.01); *H01L 27/156* (2013.01); *H01L 33/56* (2013.01); *H01L 33/62* (2013.01)

(58) Field of Classification Search
CPC ......... G02F 1/133608; G02F 1/133308; G02F 1/133603; G02F 1/133524; H01L 33/486; H01L 27/156; H01L 25/0753; F21S 2/00
See application file for complete search history.

(56) References Cited

U.S. PATENT DOCUMENTS

| | | |
|---|---|---|
| 9,239,134 B1 | 1/2016 | Macias |
| 2008/0137328 A1 | 6/2008 | Lee et al. |
| 2010/0053505 A1 | 3/2010 | Yamazaki et al. |

(Continued)

FOREIGN PATENT DOCUMENTS

| | | |
|---|---|---|
| CN | 104407460 | 3/2015 |
| JP | 2000-100219 | 4/2000 |

(Continued)

OTHER PUBLICATIONS

Chinese Office Action dated Jul. 26, 2023 in corresponding Chinese Application No. 202110244901.5.

*Primary Examiner* — Antonio B Crite
(74) *Attorney, Agent, or Firm* — K&L Gates LLP

(57) ABSTRACT

According to one embodiment, an illumination device comprises a first mounting board including a plurality of first light emitting elements, a second mounting board including a plurality of second light emitting elements, and a first wiring board including a first wiring line electrically connected to at least one of the plurality of first light emitting elements and the plurality of second light emitting elements. The first mounting board and the second mounting board extend in a first direction and are arranged along a second direction intersecting the first direction. The first wiring board is superposed on the first mounting board and the second mounting board. The first wiring board has rigidity that is lower than rigidity of each of the first mounting board and the second mounting board.

14 Claims, 20 Drawing Sheets

(51) Int. Cl.
*H01L 33/58* (2010.01)
*H01L 33/62* (2010.01)

(56) References Cited

U.S. PATENT DOCUMENTS

2011/0176083 A1    7/2011  Hamada
2013/0278860 A1*  10/2013  Choi ................. G02F 1/133608
                                                          349/58

FOREIGN PATENT DOCUMENTS

JP      2010-002486      1/2010
JP      2010055952  A    3/2010
WO      2008096470  A1   8/2008

* cited by examiner

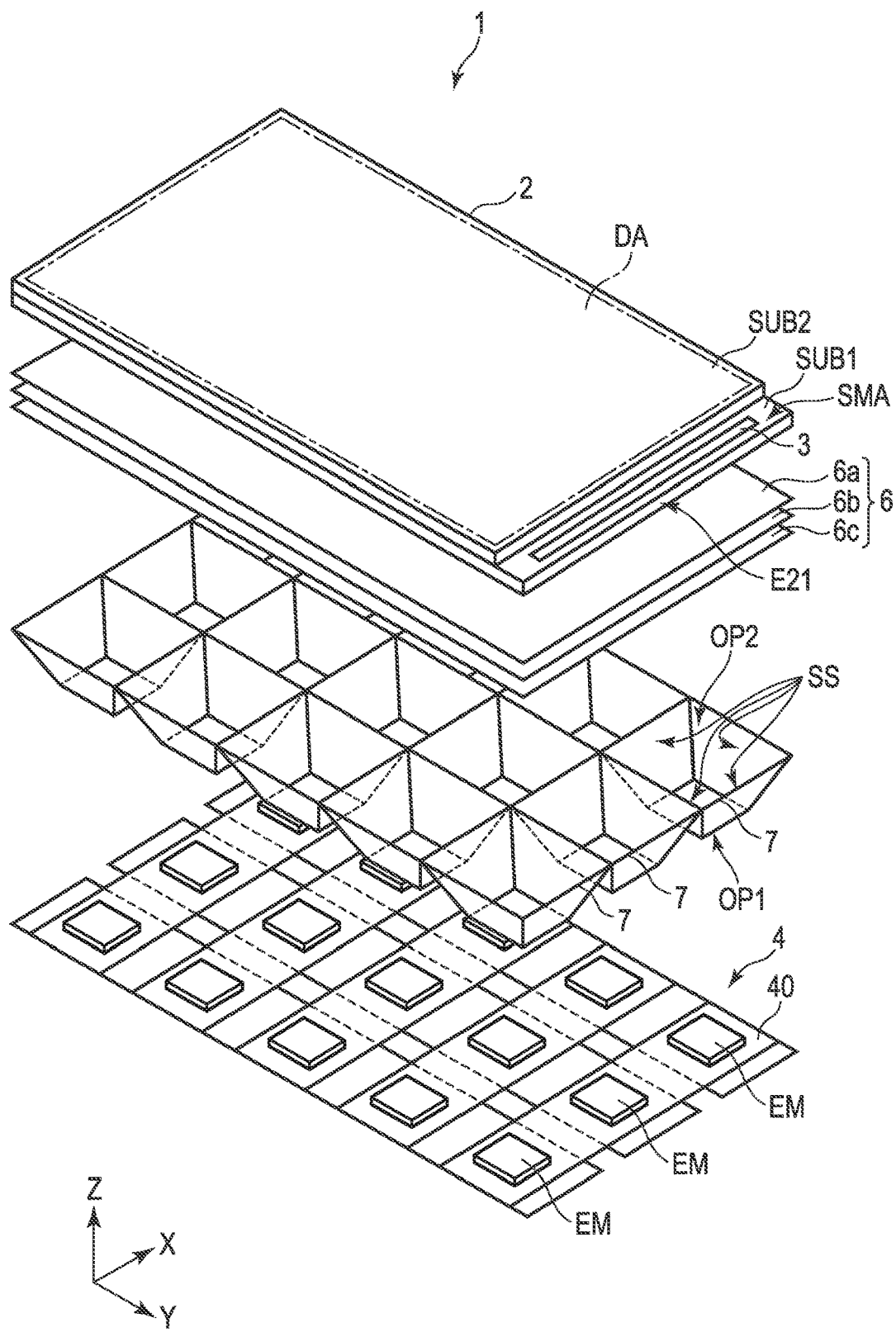
F I G. 2

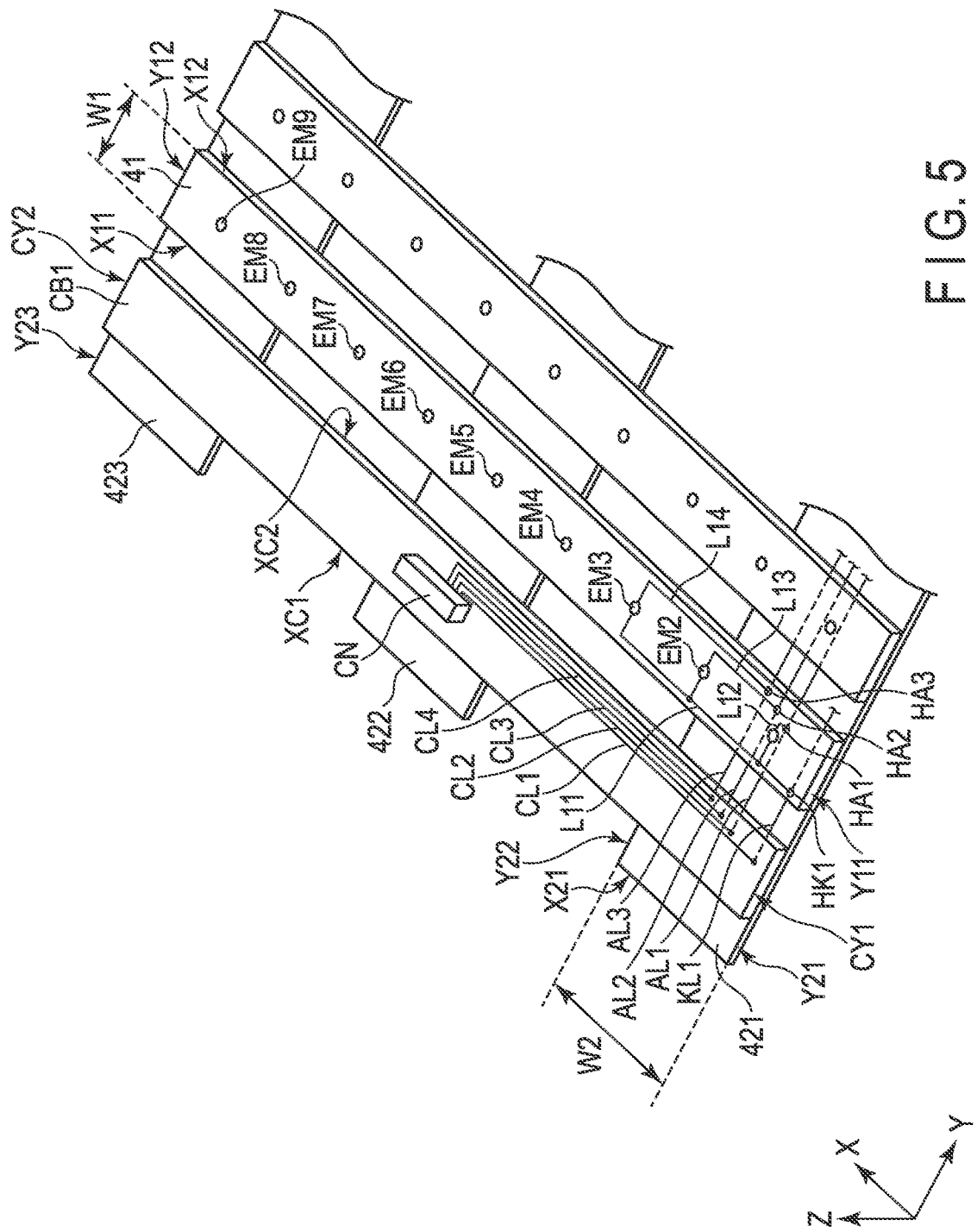
F I G. 5

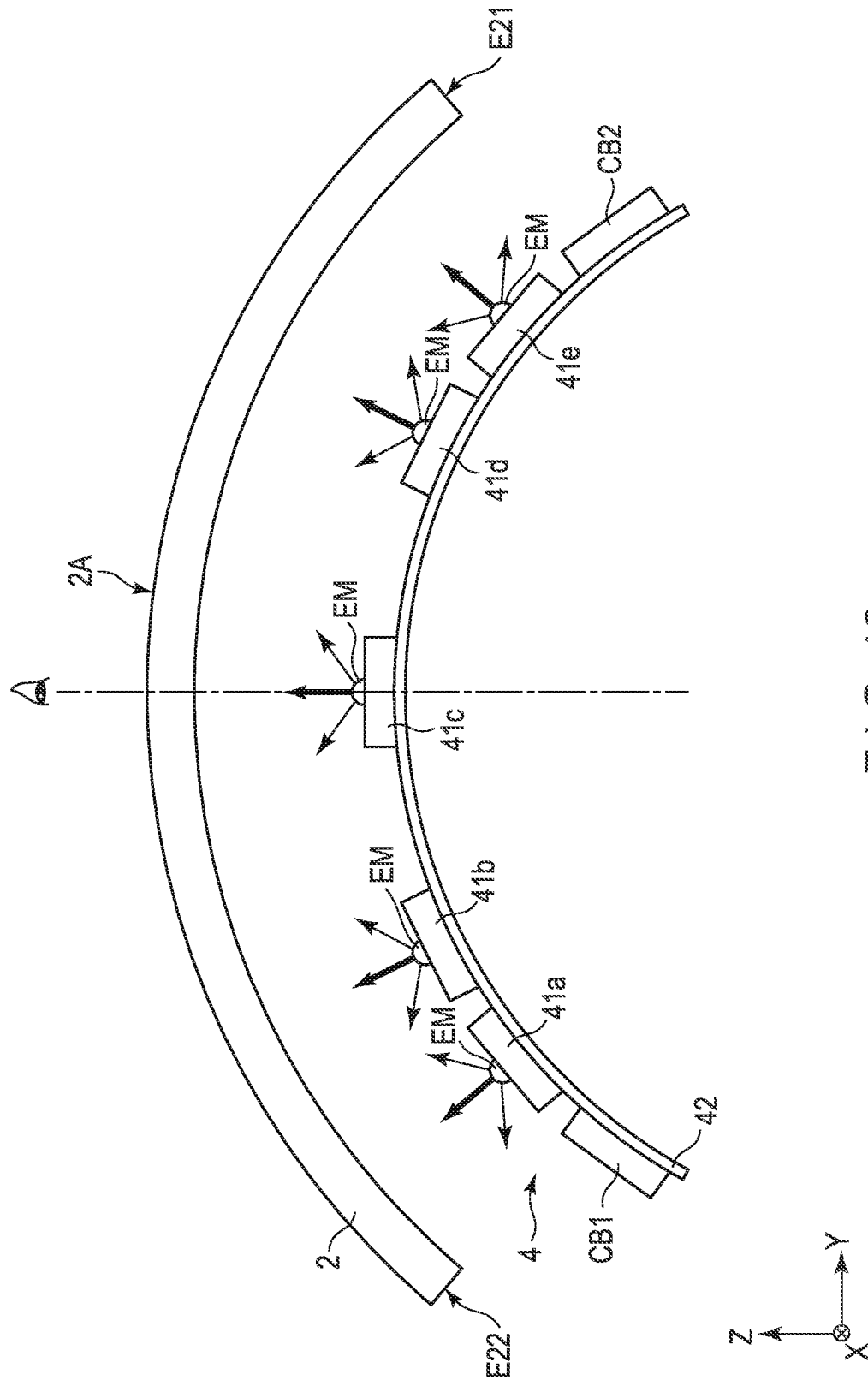
F I G. 12

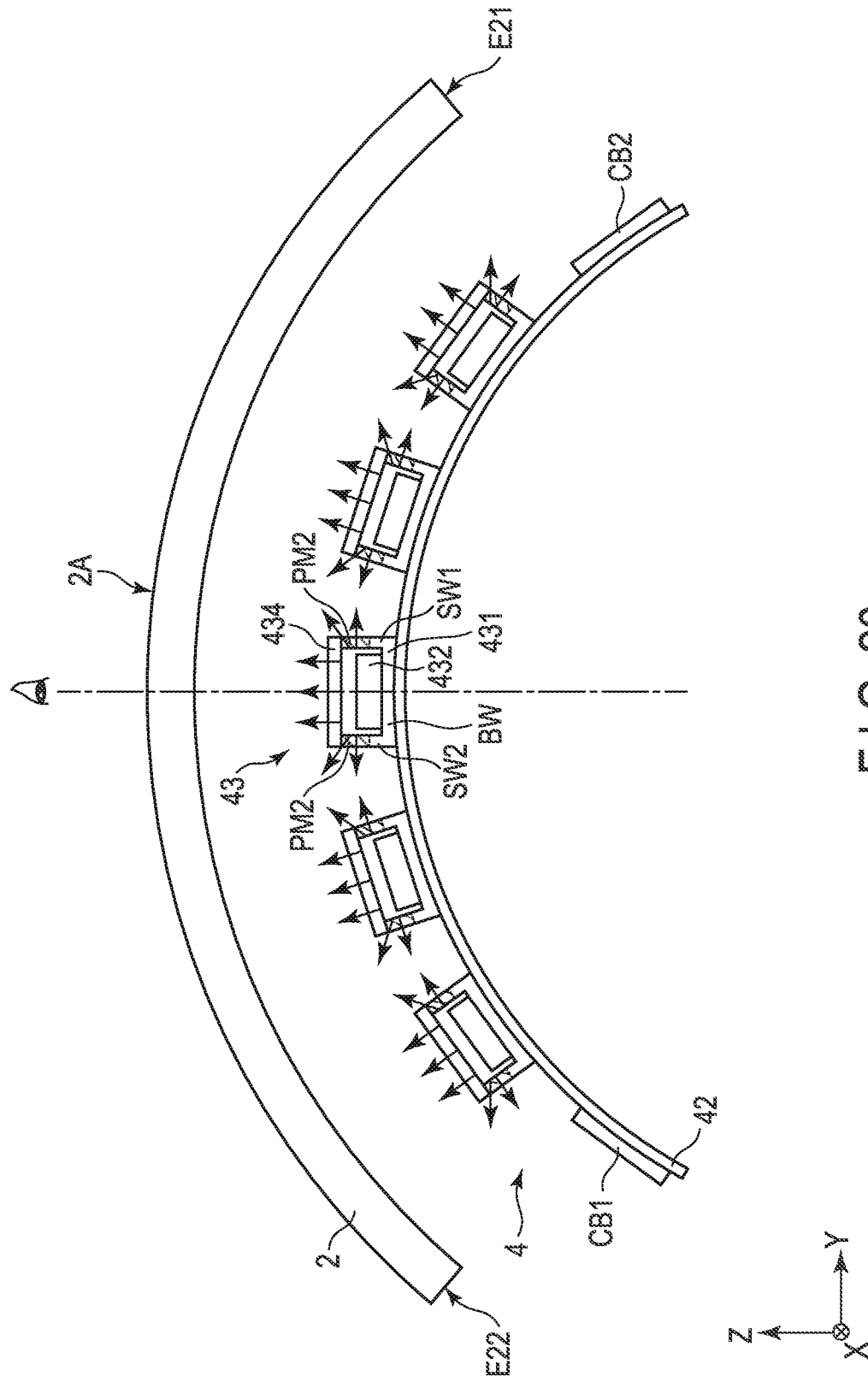
F I G. 20

ILLUMINATION DEVICE AND DISPLAY DEVICE

CROSS-REFERENCE TO RELATED APPLICATIONS

This application is based upon and claims the benefit of priority from Japanese Patent Application No. 2020-054360, filed Mar. 25, 2020, the entire contents of which are incorporated herein by reference.

FIELD

Embodiments described herein relate generally to an illumination device and a display device including the illumination device.

BACKGROUND

In general, a display device including a liquid crystal display panel is often provided with an illumination device superposed on the liquid crystal display panel. In recent years, a bendable liquid crystal display panel has been developed. It is desired in a display device including such a liquid crystal display panel that an illumination device be bendable like the liquid crystal display panel.

An illumination device configured using, for example, a flexible printed wiring board is flexible, but the flexible printed wiring board is easy to degrade due to heat and light emitted from a light source. In contrast, an illumination device configured using, for example, a glass epoxy substrate is highly resistance to heat and light, but it is rigid and thus hard to bend. It is therefore difficult to achieve an illumination device having both flexibility and durability.

SUMMARY

The present disclosure relates generally to an illumination device and a display device including the illumination device.

According to an embodiment, an illumination device comprises a first mounting board including a plurality of first light emitting elements, a second mounting board including a plurality of second light emitting elements, and a first wiring board including a first wiring line electrically connected to at least one of the plurality of first light emitting elements and the plurality of second light emitting elements. The first mounting board and the second mounting board extend in a first direction and are arranged along a second direction intersecting the first direction. The first wiring board is superposed on the first mounting board and the second mounting board. The first wiring board has rigidity that is lower than rigidity of each of the first mounting board and the second mounting board.

BRIEF DESCRIPTION OF THE DRAWINGS

FIG. 2 is a schematic exploded perspective view of the display device 1 shown in FIG. 1.

FIG. 5 is an enlarged view of part of the illumination device 4 shown in FIG. 4.

FIG. 12 is a diagram showing an example of a bent state of a display device 1 including the illumination device 4 of the second modification.

FIG. 20 is a diagram showing an example of a bent state of the display device 1 according to the second embodiment.

DETAILED DESCRIPTION

Figure 1:
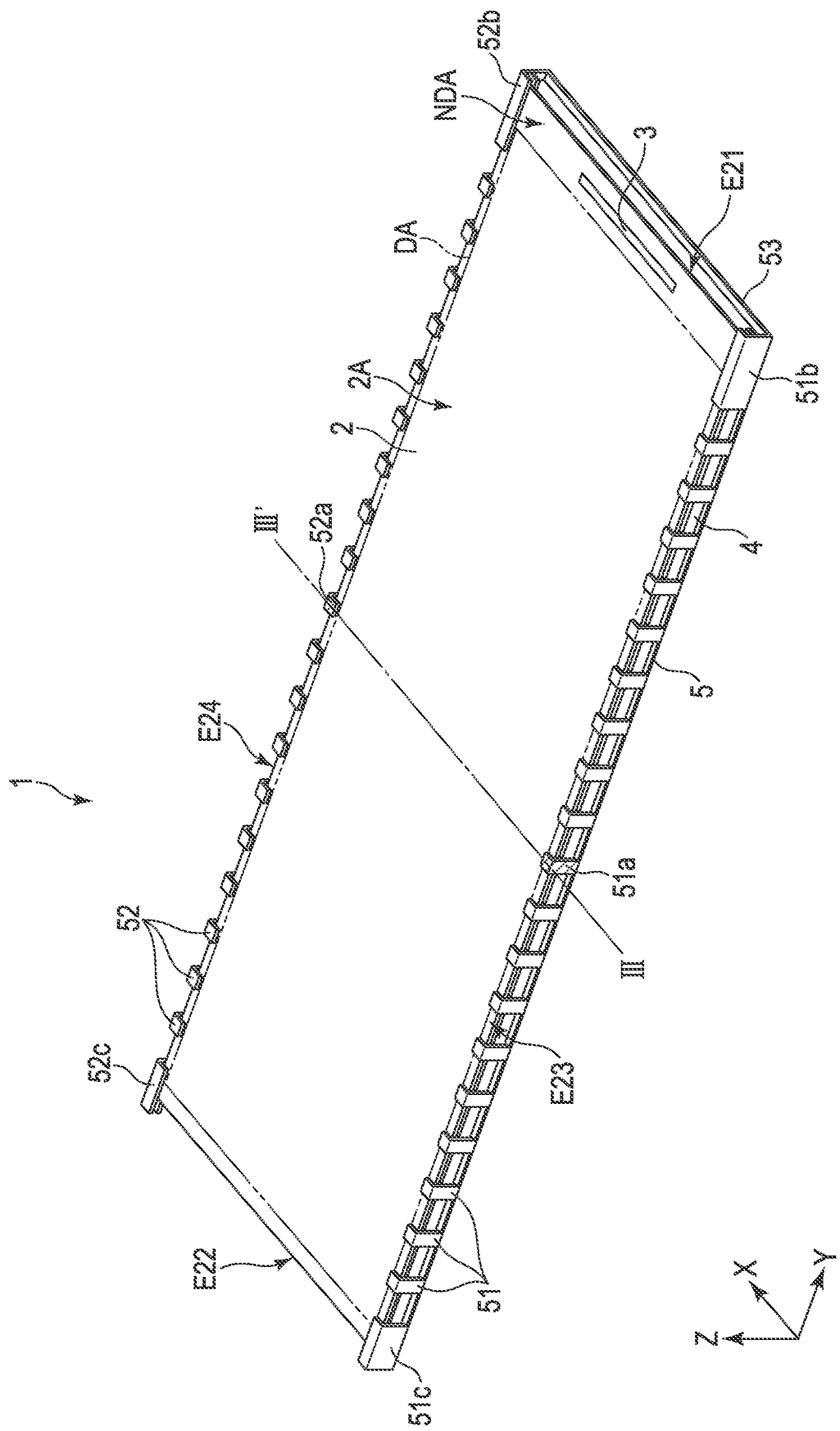
FIG. 1 is a perspective view showing an example of a display device 1 according to a first embodiment.

In general, according to one embodiment, an illumination device comprises a first mounting board including a plurality of first light emitting elements, a second mounting board including a plurality of second light emitting elements, and a first wiring board including a first wiring line electrically connected to at least one of the plurality of first light emitting elements and the plurality of second light emitting elements. The first mounting board and the second mounting board extend along a first direction and are arranged along a second direction intersecting the first direction, and the first wiring board is superposed on the first mounting board and the second mounting board, and has rigidity that is lower than rigidity of each of the first mounting board and the second mounting board.

According to another embodiment, an illumination device comprises a first light emitting unit including a first light emitting element, a second light emitting unit including a second light emitting element, and a first wiring board including a first wiring line electrically connected to at least one of the first light emitting element and the second light emitting element. The first light emitting unit and the second light emitting unit extend along a first direction, are arranged along a second direction intersecting the first direction, and are bonded to the first wiring board, and the first wiring board is superposed on the first light emitting unit and the second light emitting unit, and has rigidity that is lower than rigidity of each of the first light emitting unit and the second light emitting unit.

According to yet another embodiment, a display device comprises an illumination device, and a display panel which selectively transmits light emitted from the illumination device. The illumination device includes a first board including a plurality of first light emitting elements, a second board including a plurality of second light emitting elements, a first wiring board including a first wiring line electrically connected to at least one of the plurality of first light emitting elements and the plurality of second light emitting elements. The first board and the second board extend along a first direction and are arranged along a second direction intersecting the first direction, and the first wiring board is superposed on the first board and the second board, and has rigidity that is lower than rigidity of each of the first board and the second board.

The foregoing configurations make it possible to provide an illumination device and a display device, which can easily be bent and can be prevented from degrading.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

First Embodiment

FIG. 1 is a perspective view showing an example of a display device 1 according to a first embodiment. In FIG. 1, a first direction X, a second direction Y and a third direction Z are orthogonal to each other, but may intersect at an angle other than 90 degrees. In the following descriptions, the direction of an arrow indicating the third direction Z will be referred to as "upward" (or "up"), and a direction opposite to that of the arrow will be referred to as "downward" (or "down"). In the phrases "a second member above a first member" and "a second member below a first member", the second member may be in contact with the first member or may be separated from the first member.

A liquid crystal display device will be described as an example of the display device 1 of the first embodiment. The liquid crystal display device can be applied to a variety of devices such as a smartphone, a tablet, a mobile phone, a notebook personal computer, an in-vehicle device, and a game console.

The display device 1 includes a display panel 2, an IC chip 3, an illumination device 4 and a case 5.

The display panel 2 is, for example, an active matrix liquid crystal display panel. In the example shown in FIG. 1, the display panel 2 is substantially rectangular. The display panel 2 has end portions E21 and E22 extending along the first direction X and end portions E23 and E24 extending along the second direction Y. In the example, the length of each of the end portions E23 and E24 is greater than that of each of the end portions E21 and E22. The display panel 2 includes a display area DA in which an image is displayed and a non-display area NDA surrounding the display area DA. The display area DA corresponds to an area with a liquid crystal layer and includes a plurality of pixels (not shown). Each of the pixels is a minimum unit capable of controlling video signals individually. The non-display area NDA is located outside the display area DA. In the example shown, the non-display area NDA is provided like a frame surrounding the display area DA. In the first embodiment, the display panel 2 is flexible.

The IC chip 3 functions as a signal supply source that supplies a signal necessary for driving the display panel 2. In the example shown, the IC chip 3 is mounted on the non-display area NDA along the end portion E21. Note that all or some of the functions of the IC chip 3 may be mounted on another substrate such as a flexible printed wiring board mounted on the display panel 2.

The illumination device 4 has a substantially rectangular shape and its size is almost equal to that of the display panel 2. The illumination device 4 thus overlaps the display panel 2. In the example shown, the illumination device 4 is located under the display panel 2. The display panel 2 is therefore a transmissive display panel which selectively transmits light emitted from the illumination device 4 to display an image. In the first embodiment, the illumination device 4 is flexible.

The case 5 holds the display panel 2 and the illumination device 4. The case 5 is formed of resin or metal such as aluminum and is flexible. The case 5 includes a plurality of latch parts 51 and 52 that latch the display panel 2 and the illumination device 4. The case 5 has a flat plate-like bottom portion 53. The bottom portion 53 has a substantially rectangular flat and its size is almost equal to that of the illumination device 4. The case 5 supports the illumination device 4. The latch parts 51 and 52 are provided on their end portions E23 and E24 and arranged at equal intervals along the second direction Y. Each of the latch parts 51 and 52 extends from the bottom portion 53 toward the third direction Z alongside the illumination device 4 and the display panel 2, and its one end portion is bent to overlap the display surface 2A of the display panel 2. In the example shown, the latch parts 51 and 52 are opposed to each other along the first direction X, and the number of latch parts 51 and that of latch parts 52 are equal to each other.

The display panel 2 and the illumination device 4 are bonded to the case 5 by an adhesive. The adhesive is, for example, applied to a pair of latch parts 51a and 52a as hatched in FIG. 1. The latch parts 51a and 52a are positioned in the middle of the display device 1 in the second direction Y. The positions of the adhesive, that is, the positions where the display panel 2 and illumination device 4 are fixed to the case 5, are arranged along the first direction X. The display device 1 can thus be bent and stretched around an axis parallel to the first direction X. Note that the positions of the adhesive are not limited to those in the example shown. The adhesive may be applied to, for example, a pair of latch parts 51b and 52b located closer to the end portion E21 and a pair of latch parts 51c and 52c located closer to the end portion E22.

FIG. 2 a schematic exploded perspective view of the display device 1 shown in FIG. 1. The display device 1 includes an optical sheet 6 (6a, 6b, 6c) and light guides 7 in addition to the display panel 2, IC chip 3 and illumination device 4. The display panel 2, optical sheet 6, light guides 7 and illumination device 4 are arranged along the third direction Z in the order presented.

The display panel 2 includes a first substrate SUB1, a second substrate SUB2, and a liquid crystal layer (not shown). Each of the first and second substrates SUB1 and SUB2 is a flexible substrate formed of a transparent organic insulating material such as polyimide. The first and second substrates SUB1 and SUB2 are opposed to each other along the third direction Z and bonded together by a sealing member. The liquid crystal layer is formed in an area surrounded by the sealing member between the first and second substrates SUB1 and SUB2. The first substrate SUB1 includes a mounting portion SMA which does not overlap with the second substrate SUB2. In the example shown, the mounting portion SMA extends along the end portion E21 of the display panel 2. The IC chip 3 is mounted on the mounting portion SMA.

The optical sheet 6 is located between the display panel 2 and the light guides 7. The optical sheet 6a is located closer to the display panel 2. The optical sheet 6a is, for example, a prism sheet. The optical sheet 6b is located between the optical sheets 6a and 6c. The optical sheet 6b is, for example, a diffusion sheet. The optical sheet 6c is located closer to the illumination device 4. The optical sheet 6c is, for example, a phosphor sheet. The optical sheets 6a, 6b and 6c each have substantially the same size and shape as the display panel 2, and are superposed on at least all of the display area DA. Note that the phosphor sheet may be excluded. The number of diffusion sheets is not limited to one but may be two or more and, in this case, more uniform light can be extracted.

The illumination device 4 includes a base 40 and light emitting elements EM. Although the base 40 will be described in detail later, it has substantially the same size as the display panel 2 and is formed of a plurality of substrates arranged in a lattice. The light emitting elements EM are, for example, light emitting diodes (LED). The light emitting elements EM are mounted on the surface of the base 40 which is opposed to the display panel 2. In the example shown, the light emitting elements EM are arranged in a matrix along the first direction X and second direction Y.

The light guides 7 are provided between the optical sheet 6 and the illumination device 4. The light guides 7 are arranged in a matrix to face each of the light emitting elements EM. The light guides 7 are each formed like a truncated pyramid so as to guide light emitted from the light emitting elements EM toward the optical sheet 6. More specifically, each of the light guides 7 has a side surface SS surrounding its corresponding light emitting element EM and openings OP1 and OP2 defined by the side surface SS. The opening OP1 is opposed to its corresponding light emitting element EM. The opening OP2 is opposed to the optical sheet 6c. The area of the opening OP2 is larger than that of the opening OP1. In the example shown, the openings OP1 and OP2 are rectangular. Note that the shape of the light guides 7 is not limited to the example shown. The shape of the openings OP1 and OP2 may be a polygon other than the rectangle and a circle or an ellipse.

Figure 3:
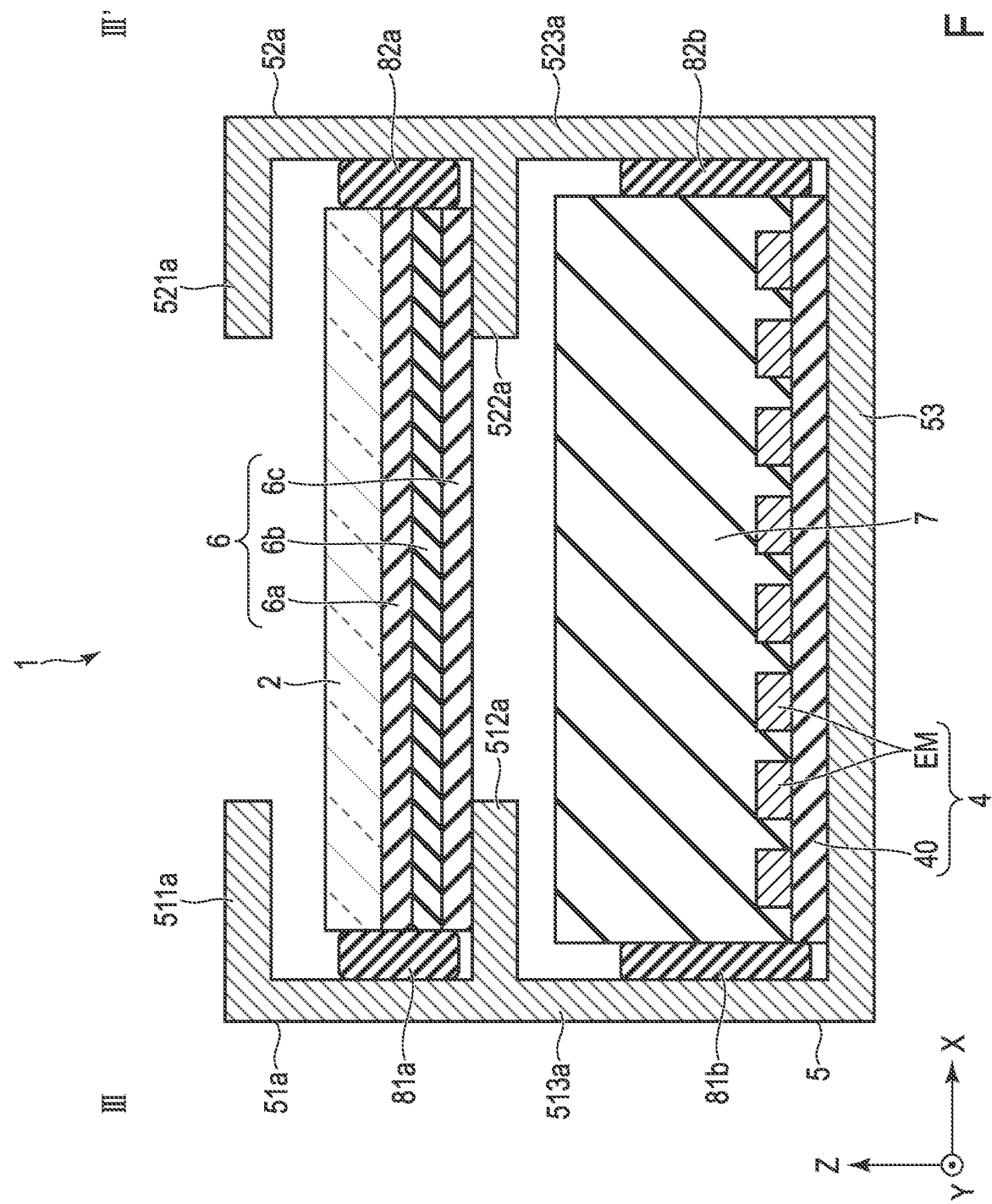
FIG. 3 is a sectional view taken along line of FIG. 1.

FIG. 3 is a sectional view taken along line shown in FIG. 1. FIG. 3 shows a plane parallel to an X-Z plane defined by the first direction X and third direction Z. In FIG. 3, only a configuration necessary for descriptions is shown, and the illumination device 4 and the light guides 7 are simplified.

The latch part 51a includes a side wall 513a and claws 511a and 512a. The side wall 513a extends along the third direction Z from the bottom portion 53. The claws 511a and 512a extend from the side wall 513a toward the latch part 52a. In the example shown, the claws 511a and 512a are shaped like a flat plate and extend along the first direction X. The claw 511a is located immediately above the claw 512a.

The latch part 52a includes a side wall 523a and claws 521a and 522a. The side wall 523a extends along the third direction Z from the bottom portion 53. The claws 521a and 522a extend from the side wall 523a toward the latch part 51a. In the example shown, the claws 521a and 522a are shaped like a flat plate and extend along the first direction X. The claw 521a is located immediately above the claw 522a.

The claws 511a and 521a are located at equal distance from the bottom portion 53. In other words, the claws 511a and 521a at the same level. Also, the claws 512a and 522a are located at equal distance from the bottom portion 53. In other words, the claws 512a and 522a are at the same level.

The display panel 2 and the optical sheet 6 are located between the claws 511a and 512a and between the claws 521a and 522a in the third direction Z. In the example shown, the optical sheet 6c is in contact with the claws 512a and 522a. The display panel 2 is separated from the claws 511a and 521a.

The illumination device 4 and the light guides 7 are located between the claw 512a and the bottom portion 53 and between the claw 522a and the bottom portion 53 in the third direction Z. In the example shown, the base 40 of the illumination device 4 is in contact with the bottom portion 53. The light guides 7 are separated from the claws 512a and 522a.

The display device 1 includes a first adhesive 81 (81a, 81b) and a second adhesive 82 (82a, 82b) for bonding the display panel 2, optical sheet 6, light guides 7 and illumination device 4 to the case 5. The first adhesive 81 and second adhesive 82 are made of resin such as epoxy, polyimide and acrylic. Note that the display panel 2, optical sheet 6, light guide 7 and illumination device 4 may be fixed to the case 5 by a double-faced tape.

The first adhesive 81 is used to bond the display panel 2 and illumination device 4 to the latch part 51a. More specifically, the first adhesive 81a is applied between the side wall 513a and the display panel 2 and between the side wall 513a and the optical sheet 6 such that they are in contact with each other. The first adhesive 81b is applied between the side wall 513a and the illumination device 4 and between the side wall 513a and the light guides 7 such that they are in contact with each other.

The second adhesive 82 is used to bond the display panel 2 and illumination device 4 to the latch part 52a. More specifically, the second adhesive 82a is applied between the side wall 523a and the display panel 2 and between the side wall 513a and the optical sheet 6 such that they are in contact with each other. The second adhesive 82b is applied between the side wall 523a and the illumination device 4 and between the side wall 523a and the light guides 7 such that they are in contact with each other.

Figure 4:
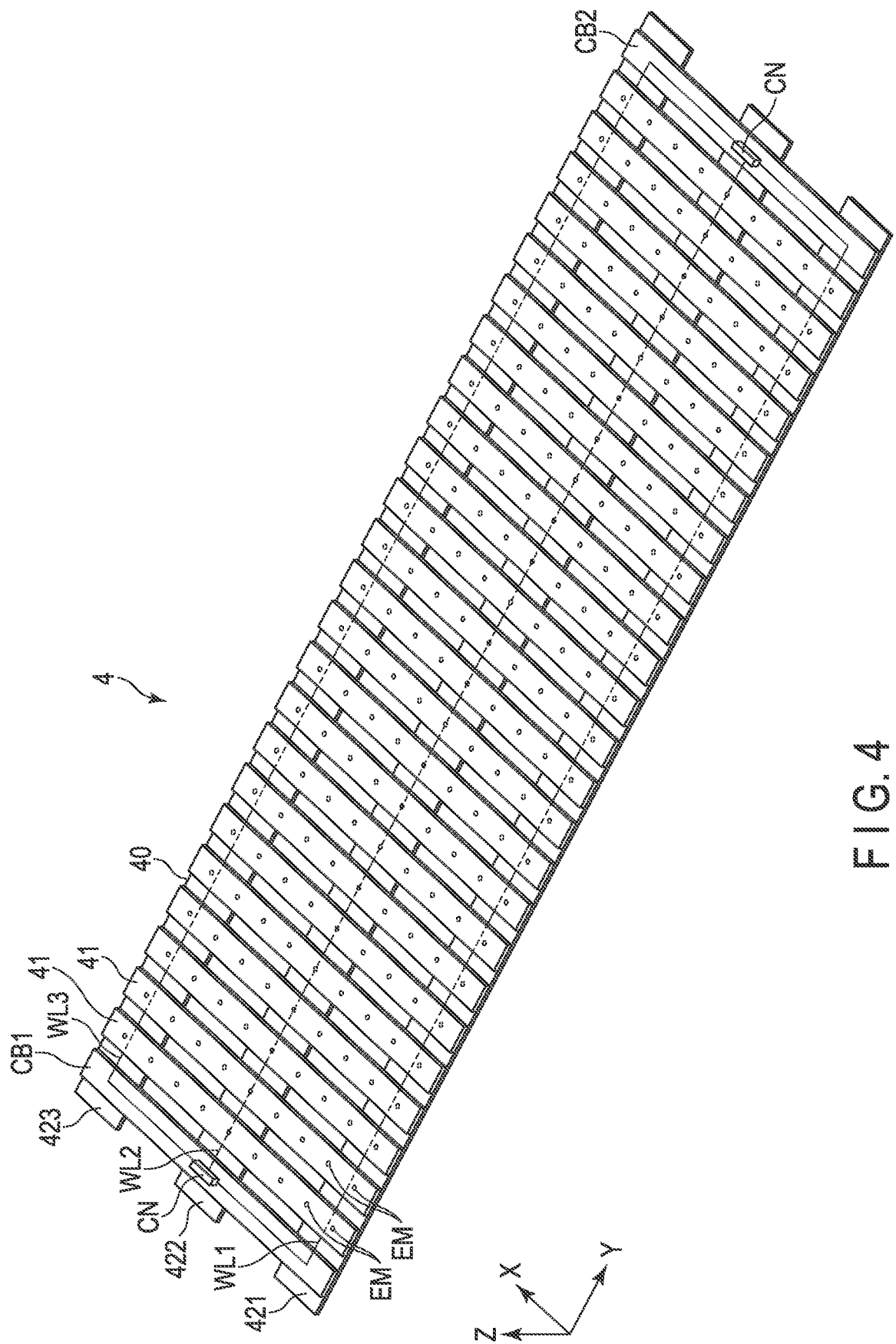
FIG. 4 is a perspective view showing an example of an illumination device 4 shown in FIG. 1.

FIG. 4 is a perspective view showing an example of the illumination device 4 shown in FIG. 1. In the first embodiment, the base 40 of the illumination device 4 is configured by two substrates having different rigidities. That is, the base 40 includes a plurality of mounting boards 41 and a plurality of wiring boards 42 (421, 422, 423) whose rigidity is lower than that of the mounting boards 41.

The mounting boards 41 are, for example, glass epoxy substrates. Each of the mounting boards 41 is shaped like a belt having a fixed width and extends along the first direction X. In the example shown, the mounting boards 41 are arranged at equal intervals along the second direction Y. All of the mounting boards 41 are disposed on the wiring board 42 and superposed on the wiring boards 421, 422 and 423. In the first embodiment, the light emitting elements EM are mounted on their respective mounting boards 41. In the example shown, the light emitting elements EM are aligned on the mounting board 41 at equal intervals along the first direction X. The numbers of light emitting elements EM mounted on the mounting boards 41 may be the same or different from each other.

The wiring boards 42 are, for example, flexible printed wiring boards made of resin such as polyimide. The wiring boards 42 are each shaped like a belt having a fixed width and extend along the second direction Y. In the example shown, three wiring boards 421, 422 and 423 are arranged at equal intervals along the first direction X. The wiring boards 421, 422 and 423 include wiring lines WL1, WL2 and WL3 electrically connected to the light emitting elements EM. The wiring lines WL1, WL2 and WL3 extend along the second direction Y.

In the example shown, the base 40 includes connection boards CB1 and CB2 for connecting the illumination device 4 to an external device. The connection boards CB1 and CB2 each include a connector CN electrically connected to the wiring lines WL1, WL2 and WL3. For example, the connection boards CB1 and CB2 are formed of the same material as the mounting boards 41 and formed in the same shape as the mounting boards 41. The connection boards CB1 and CB2 are located at both ends of the base 40 in the second direction Y and superposed on the wiring boards 421, 422 and 423. That is, all of the mounting boards 41 are disposed between the connection boards CB1 and CB2. In the example shown, an interval between the connection boards CB1 and CB2 and their adjacent mounting board 41 is equal to an interval between adjacent two mounting boards 41. In the example shown, neither of the connection boards CB1 and CB2 includes the light emitting elements EM; however, like the mounting boards 41, they may include the light emitting elements EM. In addition, one of the connection boards CB1 and CB2 may be excluded. In other words, the base 40 may have only to include one connector CN.

FIG. 5 is an enlarged view of part of the illumination device 4 shown in FIG. 4. The part of the illumination device 4 shown in FIG. 5 is in the vicinity of the connection board CB1.

The wiring board 421 includes an end portion X21 extending along the first direction X and a pair of end portions Y21 and Y22 extending along the second direction Y. The end portion Y21 is separated from the wiring board 422, and the end portion Y22 is opposed to the wiring board 422. The wiring board 423 includes an end portion Y23 extending along the second direction Y. The end portion Y23 is separated from the wiring board 422.

The mounting board 41 is substantially rectangular and includes a pair of end portions X11 and X12 extending along the first direction X and a pair of end portions Y11 and Y12 extending along the second direction Y. The end portion X11 is opposed to the connection board CB1, and the end portion X12 is separated from the connection board CB1.

The connection board CB1 is substantially rectangular and includes a pair of end portions XC1 and XC2 extending along the first direction X and a pair of end portions YC1 and YC2 extending along the second direction Y. The end portion XC1 is separated from the mounting board 41, and the end portion XC2 is opposed to the mounting board 41.

In the example shown, the length of the mounting board 41 is equal to a distance between the end portions Y21 and Y23. In other words, the end portions Y11 and YC1 are superposed on the end portion Y21, and the end portions Y12 and YC2 are superposed on the end portion Y23. In the second direction Y, the wiring boards 421, 422 and 423 extend outward from the connection board CB1. In other words, the end portion X21 is not superposed on the end portion XC1.

In the example shown, the width W1 of the mounting board 41 is smaller than the width W2 of the wiring board 421. The width W1 is along the second direction Y, and the width W2 is along the first direction X. In the example shown, the width of the connection board CB1 along the second direction Y is equal to the width W1, but they may be different from each other.

The mounting board 41 includes nine light emitting elements EM1, EM2, EM3, EM4, EM5, EM6, EM7, EM8 and EM9, for example. In the first embodiment, one wiring board 42 is electrically connected to three light emitting elements EM. That is, the light emitting elements EM1, EM2 and EM3 are electrically connected to the wiring board 421. The light emitting elements EM4, EM5 and EM6 are electrically connected to the wiring board 422. The light emitting elements EM7, EM8 and EM9 are electrically connected to the wiring board 423.

Below is a description of a connection between the light emitting elements EM1, EM2 and EM3 and the wiring board 421. Neither a connection between the light emitting elements EM4, EM5 and EM6 and the wiring board 422 nor a connection between the light emitting elements EM7, EM8 and EM9 and the wiring board 423 will be described because these connections are the same as the connection between the light emitting elements EM1, EM2 and EM3 and the wiring board 421.

The wiring board 421 includes wiring lines KL1, AL1, AL2 and AL3. The wiring lines KL1, AL1, AL2 and AL3 each extend along the second direction Y. The wiring line KL1 is closer to the end portion Y21 than the wiring lines AL1, AL2 and AL3. The wiring lines AL1, AL2 and AL3 are located near the middle of the wiring board 421 in the first direction X, and are arranged along the first direction X in the order presented. In the example shown, the wiring line AL1 is closer to the end portion Y21 than the wiring line AL2, and the wiring line AL3 is closer to the end portion Y22 than the wiring line AL2. The wiring line WL1 shown in FIG. 4 corresponds to, for example, the wiring line AL1. The arrangement of the wiring lines KL1, AL1, AL2 and AL3 is not limited to the example shown but can be changed as appropriate.

The cathode electrodes of the light emitting elements EM1, EM2 and EM3 are connected to a common wiring line L11, for example. In the example shown, the wiring line L11 is disposed closer to the end portion X11. The wiring line L11 extends along the end portion X11 and is electrically connected to the wiring lines KL1 of the wiring board 421 through a connection hole HK1 formed in the mounting board 41.

The anode electrodes of the light emitting elements EM1, EM2 and EM3 are connected to different wiring lines. That is, the anode electrodes of the light emitting elements EM1, EM2 and EM3 are connected to the wiring lines L12, L13 and L14, respectively. In the example shown, the wiring lines L12, L13 and L14 are disposed closer to the end portion X12. The wiring lines L12, L13 and L14 are electrically connected to their respective wiring lines AL1, AL2 and AL3 of the wiring board 41 through their respective connection holes HAL HA2 and HA3 formed in the mounting board 421. The arrangement of the wiring lines L11, L12, L13 and L14 is not limited to the example shown but can be changed as appropriate.

The connection board CB1 includes wiring lines CL1, CL2, CL3 and CL4 connected to the connector CN. In the example shown, the wiring lines CL1, CL2, CL3 and CL4 extend along the end portion XC2. The wiring lines CL1, CL2, CL3 and CL4 are electrically connected to the wiring lines KL1, AL1, AL2 and AL3 of the wiring board 421 through a connection hole formed in the connection board CB1. Accordingly, signals supplied from an external device through the connector CN are input to the wiring lines KL1, AL1, AL2 and AL3 to control the operations of the light emitting elements EM1, EM2 and EM3. The arrangement of the wiring lines CL1, CL2, CL3 and CL4 is not limited to the example shown but can be changed as appropriate.

Figure 6:
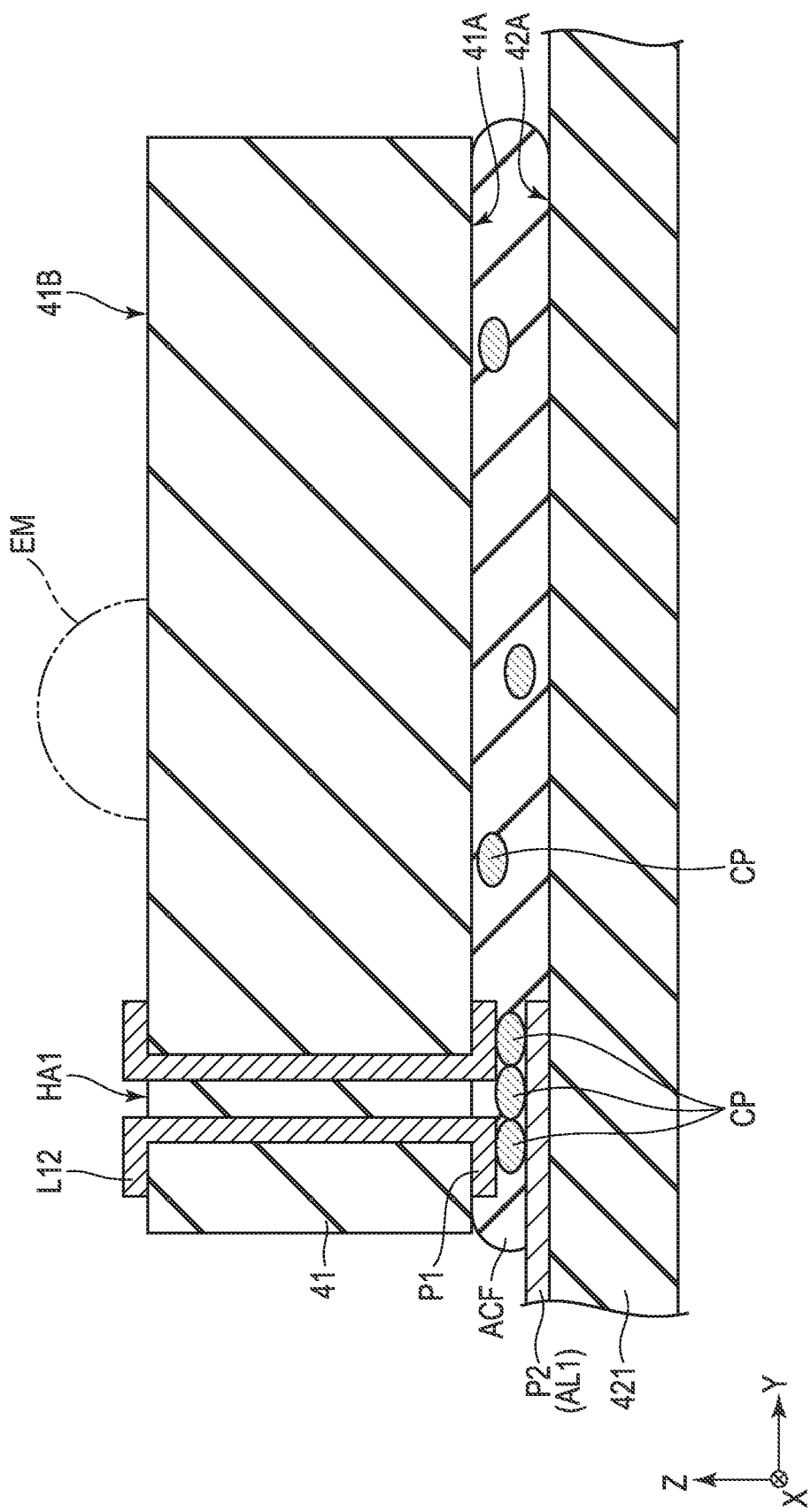
FIG. 6 is a sectional view showing an example of a connection hole HA1 shown in FIG. 5.

FIG. 6 shows an example of a section including the connection hole HA1 shown in FIG. 5. The mounting board 41 has a surface (first surface) 41A opposed to the wiring board 421 and an opposite surface (second surface) 41B of the surface 41A. The light emitting element EM is mounted on the surface 41B. The wiring board 421 has a surface (third surface) 42A opposed to the mounting board 41.

In the mounting board 41, the wiring line L12 is formed on the surface 41B. The wiring line L12 is formed of conductive materials and provided in the connection hole HA1 and on the surface 41A. The conductive materials are also used to form a pad P1. In the wiring board 421, the wiring line AL1 is formed on the surface 42A. The wiring line AL1 is formed of conductive materials. The conductive materials are also used to form a pad P2 on the surface 42A.

The mounting board 41 and wiring board 421 are bonded together by an anisotropic conductive film ACF with the pads P1 and P2 opposed to each other. In other words, the anisotropic conductive film ACF is interposed between the pads P1 and P2. The anisotropic conductive film ACF contains conductive particles CP in an adhesive. If the mounting board 41 and wiring board 421 are pressed and heated with the anisotropic conductive film ACF between the pads P1 and P2, they are bonded together, and the pads P1 and P2 are electrically connected to each other through the conductive particles CP. Thus, the wiring line L12 of the mounting board 41 and the wiring line AL1 of the wiring board 421 are electrically connected to each other. Note that the wiring lines L11 and KL1, the wiring lines L13 and AL2, and the wiring lines L14 and AL3, which are shown in FIG. 5, are connected in the same manner.

Figure 7:
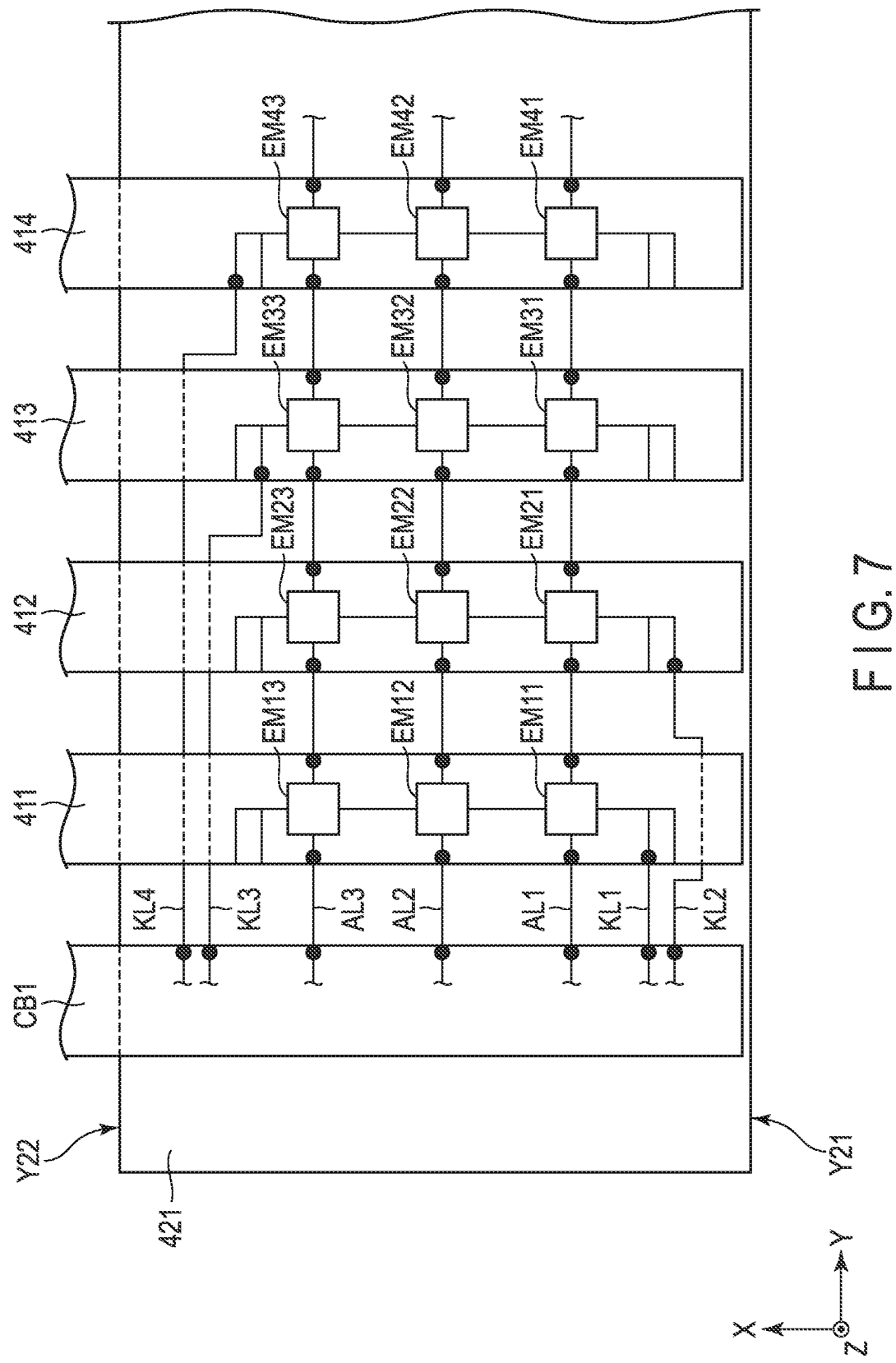
FIG. 7 is a diagram showing an example of an electrical connection between a wiring board 421 and a plurality of mounting boards 41 shown in FIG. 5.

FIG. 7 is a diagram showing an example of an electrical connection between the wiring board 421 and the mounting boards 41 shown in FIG. 5. FIG. 7 shows part of each of the wiring board 421, connection board CB1 and mounting board 41 (411, 412, 413, 414). The mounting boards 411, 412, 413 and 414 are arranged along the second direction Yin the order presented, and the mounting board 411 is closest to the connection board CB1.

In the example shown, the wiring board 421 includes wiring lines KL2, KL3 and KL4 in addition to the wiring lines KL1, AL1, AL2 and AL3. The wiring lines KL1 and KL2 are located alongside the end portion Y21. The wiring line KL2 is closer to the end portion Y21 than the wiring line KL1. The wiring lines KL3 and KL4 are located alongside the end portion Y22. The wiring line KL4 is closer to the end portion Y22 than the wiring line KL3. The wiring lines AL1, AL2 and AL3 are located between the wiring lines KL1 and KL3, and are arranged along the first direction X in the order presented.

The cathode electrodes of the light emitting elements EM mounted on the same mounting board 41 are connected to a common wiring line. Specifically, the cathode electrodes of the light emitting elements EM11, EM12 and EM13 mounted on the mounting board 411 are connected to the wiring line KL1. The cathode electrodes of the light emitting elements EM21, EM22 and EM23 mounted on the mounting board 412 are connected to the wiring line KL2. The cathode electrodes of the light emitting elements EM31, EM32 and EM33 mounted on the mounting board 413 are connected to the wiring line KL3. The cathode electrodes of the light emitting elements EM41, EM42 and EM43 mounted on the mounting board 414 are connected to the wiring line KL4.

On the other hand, the anode electrodes of the light emitting elements EM mounted on the same mounting board 41 are connected to different wiring lines. In other words, the anode electrodes of the light emitting elements EM mounted on different mounting boards 41 are connected to a common wiring line. Specifically, the anode electrodes of the light emitting elements EM11, EM21, EM31 and EM41 are connected to the wiring line AL1. The anode electrodes of the light emitting elements EM12, EM22, EM32 and EM42 are connected to the wiring line AL2. The anode electrodes of the light emitting elements EM13, EM23, EM33 and EM43 are connected to the wiring line AL3.

According to the foregoing configuration, the operations of the light emitting elements EM are controlled independently of each other. Note that the connection between the light emitting elements EM and the wiring lines is not limited to the example shown. For example, the cathode electrodes of the light emitting elements EM mounted on the same mounting board 41 may be connected to different wiring lines, and the anode electrodes of the light emitting elements EM mounted on the same mounting board 41 may be connected to a common wiring line. Alternatively, the cathode electrodes of the light emitting elements EM mounted on the same mounting board 41 may be connected to a common wiring line, and the anode electrodes of all the light emitting elements EM may be connected to another common wiring line. In this case, the operations of the light emitting elements EM are controlled for each of the mounting boards 41.

Figure 8:
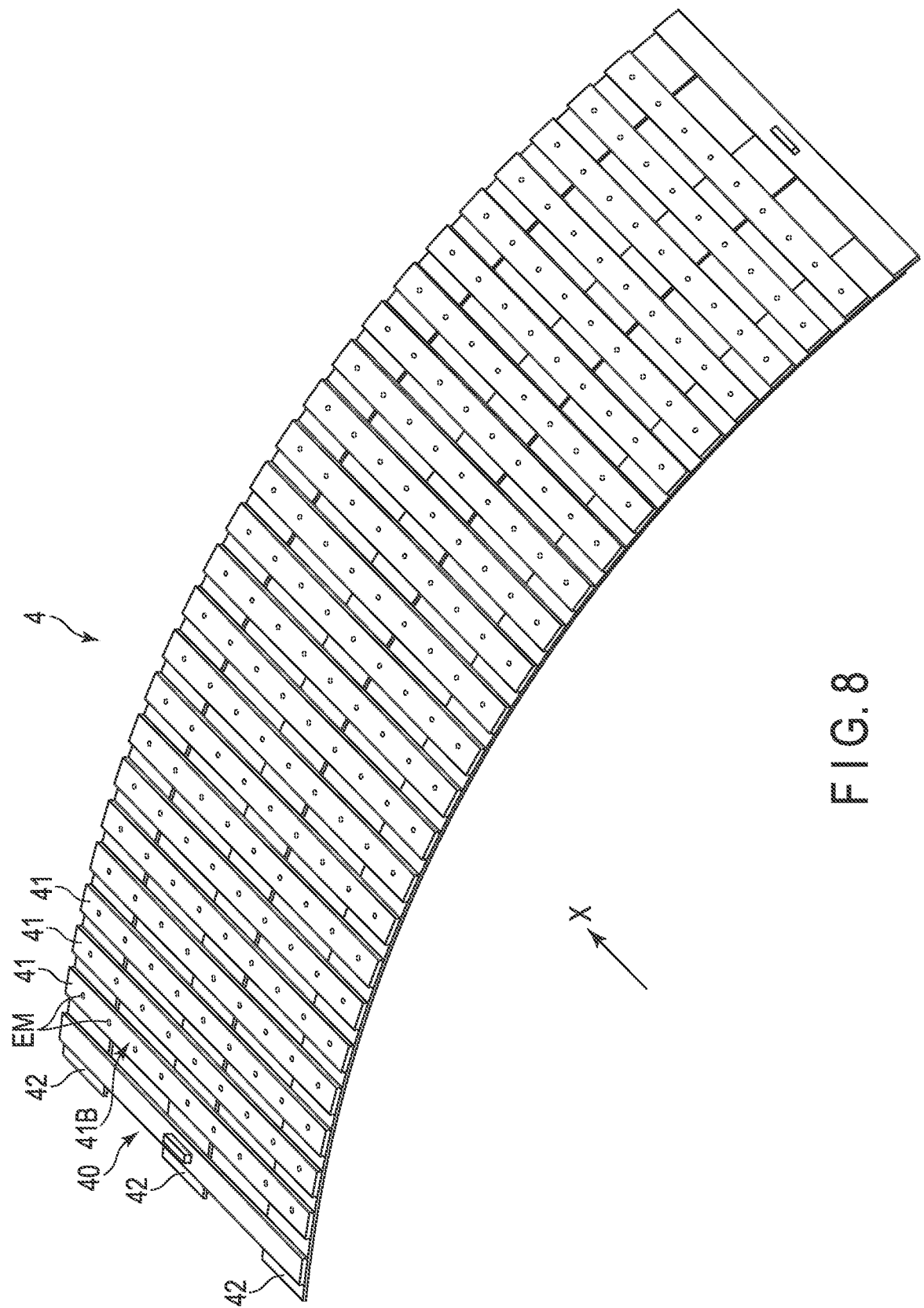
FIG. 8 is a diagram showing an example of a bent state of the illumination device 4.

FIG. 8 shows a diagram showing an example of a bent state of the illumination device 4. Since the mounting boards 41 extend along the first direction X and are spaced apart from each other, the base 40 can be bent about an axis parallel to the first direction X. In FIG. 8, the illumination device 4 is bent such that the surface 41B on which the light emitting elements EM are provided becomes convex. The illumination device 4 may be bent such that the surface 41B becomes concave and may be bent such that it has both concave and convex surfaces. That is, the illumination device 4 may be bent so as to have an inflection point.

According to the first embodiment, the base 40 of the illumination device 4 is configured by two types of boards having different rigidities. Specifically, the illumination device 4 is configured by mounting boards 41 having a light emitting element EM and wiring boards 42 whose rigidity is lower than that of the mounting boards 41. The mounting boards 41 extend along the first direction X, and are spaced apart from each other along the second direction Y, and are bonded to the wiring boards 42 extending along the second direction Y. In other words, the base 40 includes an area where only the wiring board 42 is provided and an area where the mounting board 41 and the wiring board 42 are superposed one on another. The wiring board 42 which is not superposed on a mounting board 41 can easily be bent. Therefore, the illumination device 4 can easily be bent around an axis along the first direction X.

According to the first embodiment, the mounting boards 41 are, for example, glass epoxy boards, and have higher resistance to light and heat than the wiring boards 42. Therefore, even when the light emitting elements EM are mounted on the mounting boards 41, the base 40 can be prevented from being degraded due to light and heat emitted from the light emitting elements EM.

In the first embodiment, the mounting board 411 corresponds to a first mounting board, and the light emitting elements EM11, EM12 and EM 13 correspond to first light emitting elements. The mounting board 412 corresponds to a second mounting board, and the light emitting elements EM21, EM22 and EM23 correspond to second light emitting elements. In addition, the wiring board 421 corresponds to a first wiring board, and the wiring board 422 corresponds to a second wiring board. The wiring line AL1 corresponds to a first wiring line.

A modification to the first embodiment will be described with reference to FIGS. 9 to 14.

Figure 9:
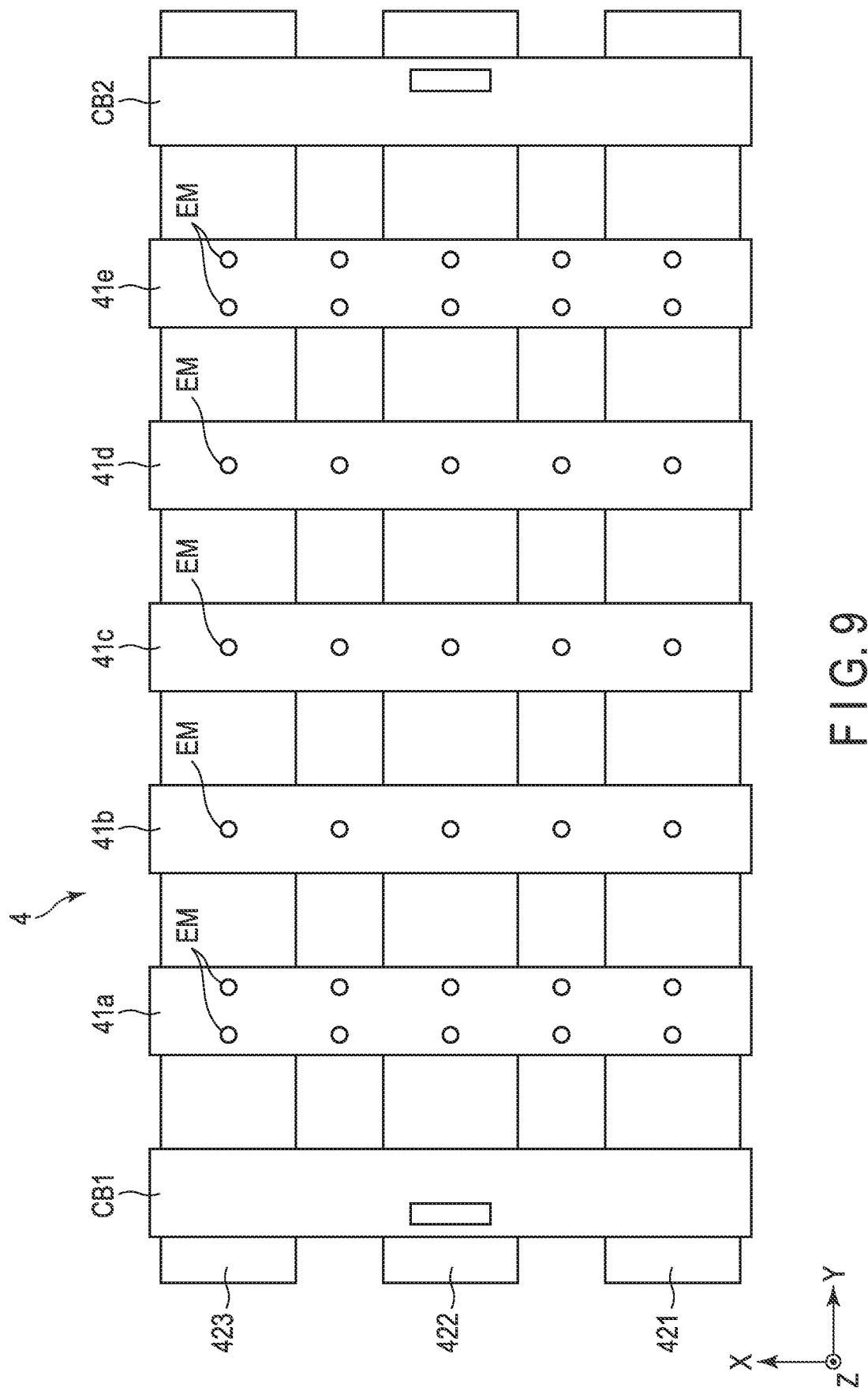
FIG. 9 is a plan view schematically showing a first modification to the illumination device 4.

FIG. 9 is a plan view schematically showing a first modification to the illumination device 4. The first modification differs from the example shown in FIG. 4 in that it includes mounting boards 41 whose light emitting elements EM are different in number. In the first modification, the illumination device 4 includes five mounting boards 41a, 41b, 41c, 41d and 41e. The mounting board 41a is adjacent to a connection board CB1, and the mounting board 41e is adjacent to the connection board CB2. The mounting boards 41b, 41c and 41d are located between the mounting boards 41a and 41e, and are arranged along the second direction Y in the order presented.

In the first modification, the number of light emitting elements EM included in the mounting boards 41a and 41e is larger than the number of light emitting elements EM included in at least the mounting board 41c. In other words, in the second direction Y, more light emitting elements EM are mounted on the end portion of the illumination device 4 than on the middle portion of the illumination device 4. In the first modification, the mounting boards 41b and 41d include the same number of light emitting elements EM as the mounting board 41c. In addition, the mounting boards 41a and 41e include light emitting elements EM two times larger than that of the mounting board 41c. In the mounting boards 41a and 41e, the light emitting elements EM are arranged in two rows at equal intervals.

Note that the number or arrangement of the light emitting elements EM is not limited to that in the first modification. The number of light emitting elements EM included in the mounting board 41a and the number of light emitting elements EM included in the mounting board 41e each have only to be larger than or different from the number of light emitting elements EM included in the mounting board 41c. The number of light emitting elements EM included in the mounting board 41b has only to be equal to or smaller than the number of light emitting elements EM included in the mounting board 41a, and the number of light emitting elements EM included in the mounting board 41d has only to be equal to or smaller than the number of light emitting elements EM included in the mounting board 41e.

Figure 10:
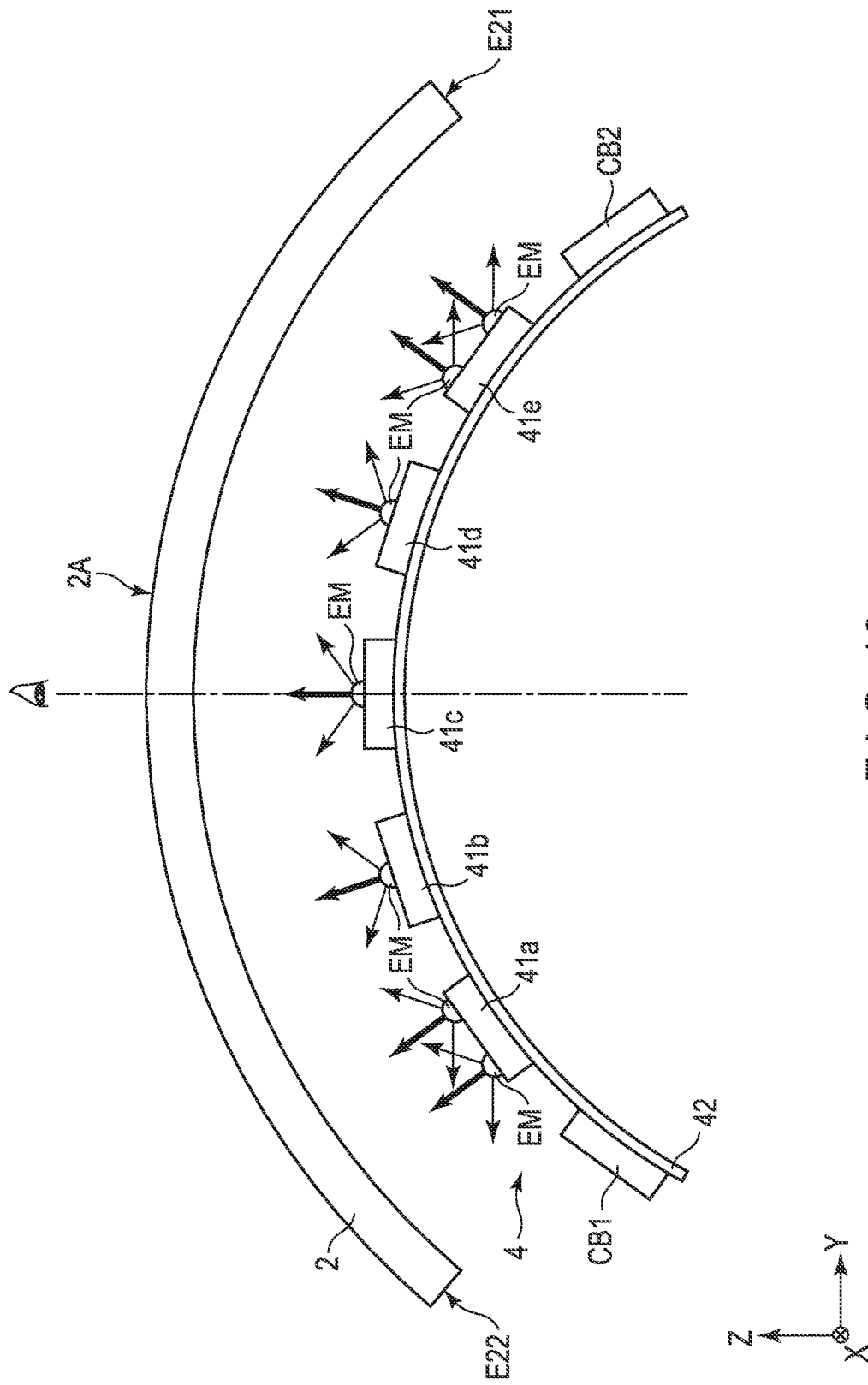
FIG. 10 is a diagram showing an example of a bent state of a display device 1 including the illumination device 4 of the first modification.

FIG. 10 is a diagram showing an example of a bent state of the display device 1 including the illumination device 4 of the first modification. In FIG. 10, only a configuration necessary for descriptions is shown, and a case, a light guide or the like is not shown. The display device 1 is bent such that end portions E21 and E22 of the display panel 2 are located below a middle part of the display surface 2A. That is, the display surface 2A is a convex surface. It is assumed that an observer of the display device 1 observes the display device 1 from the front of the display panel 2. In other words, the observer faces the display panel 2 along the third direction Z.

The illumination device 4 is bent similarly to the display panel 2. More specifically, the wiring board 42 is bent along the display panel 2. The intensity of light emitted from the light emitting elements EM is strongest in their components in the normal direction of the wiring board 42. In the case of the mounting board 41c, the light emitting element EM and the observer are opposed to each other along the normal direction of the wiring board 42. In the case of the mounting boards 41a and 41e, the light emitting elements EM and the observer are not opposed to each other along the normal direction of the wiring board 42. Thus, the intensity of light emitted from the mounting boards 41a and 41e toward the observer is lower than that of light emitted toward the normal direction of the wiring board 42. According to the first modification, however, the number of light emitting elements EM included in the mounting boards 41a and 41e is larger than the number of light emitting elements EM included in the mounting board 41c. Light emitted from the mounting boards 41a and 41e toward the observer can thus be compensated.

The first modification can also bring about the same advantages as those of the example shown in FIG. 4 because the mounting boards 41 extending along the first direction X are arranged at intervals along the second direction Y and bonded to the wiring board 42 whose rigidity is lower than that of the mounting board 41. Furthermore, the first modification can prevent light emitted from the mounting boards 41a and 41e toward an observer even though the illumination device 4 is bent. It is thus possible to reduce the nonuniformity of intensity of light to be observed and thus improve the quality of display. Note that in the first modification, the mounting board 41a corresponds to a first mounting board, the mounting board 41e corresponds to a second mounting board, and the mounting board 41c corresponds to a third mounting board.

Figure 11:
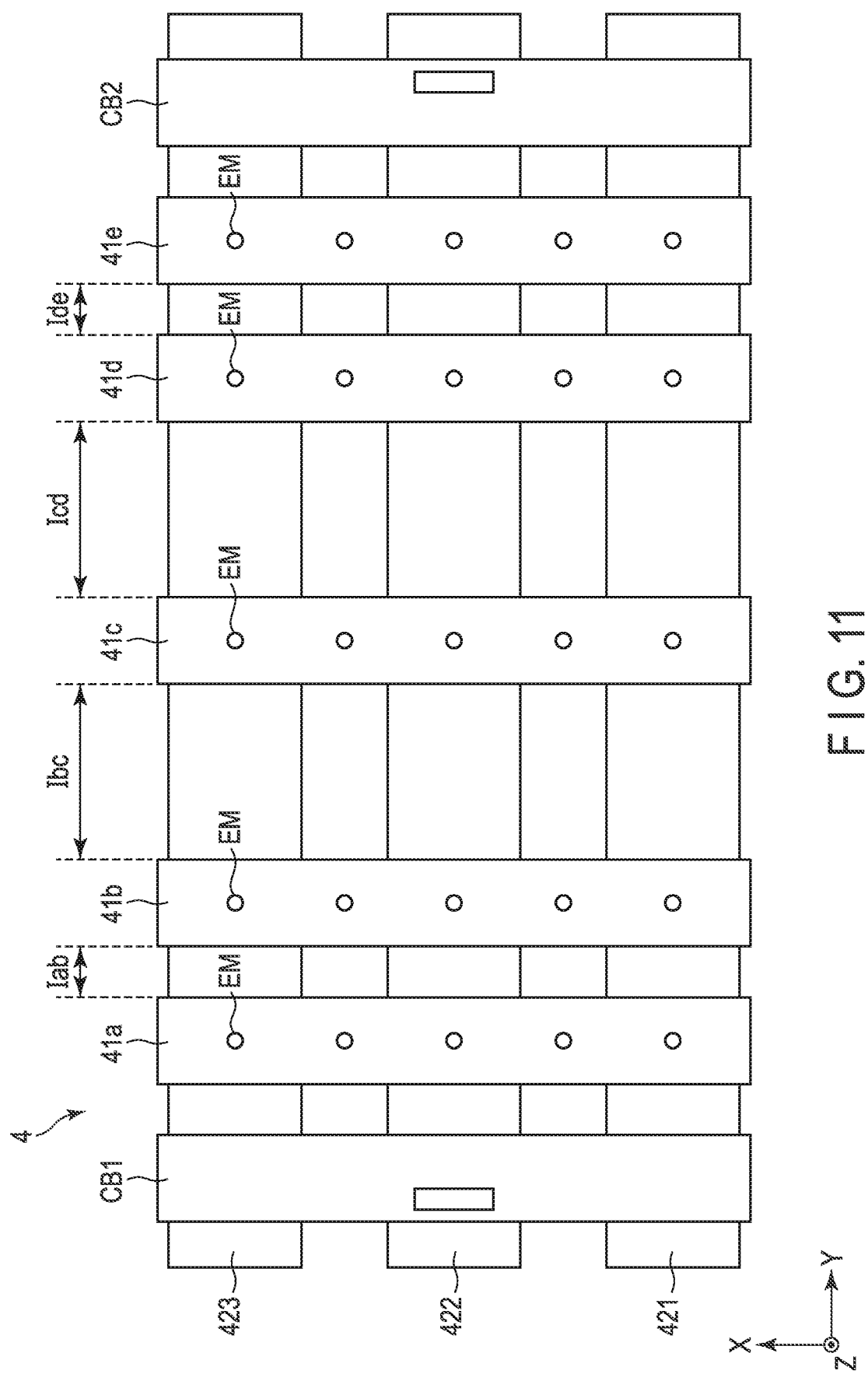
FIG. 11 is a plan view schematically showing a second modification to the illumination device 4.

FIG. 11 is a plan view schematically showing a second modification to the illumination device 4. The second modification differs from the first modification in that the mounting boards 41 are not arranged at equal intervals. In the second modification, five mounting boards 41a, 41b, 41c, 41d and 41e have the same number of light emitting elements EM.

In the second modification, the mounting boards 41 are arranged alongside the end portion of the illumination device 4 more densely than the middle portion thereof. More specifically, the mounting board 41b is closer to the mounting board 41a than the mounting board 41c. In other words, in the second direction Y, an interval Iab between the mounting boards 41a and 41b is smaller than an interval Ibc between the mounting boards 41b and 41c. The mounting board 41d is closer to the mounting board 41e than the mounting board 41c. In other words, in the second direction Y, an interval Ide between the mounting boards 41d and 41e is smaller than an interval Icd between the mounting boards 41c and 41d.

In FIG. 5, the interval Iab is equal to the interval Ide, and the interval Ibc is equal to the interval Icd. Note that the intervals Iab and Ide may be different from each other and so may be the intervals Ibc and Icd.

FIG. 12 is a diagram showing an example of a bent state of a display device 1 including the illumination device 4 of the second modification. As in FIG. 10, the display device 1 is bent such that its display surface 2A is convex. It is assumed that an observer of the display device 1 observes the display device 1 from the front of the display panel 2.

The illumination device 4 is bent similarly to the display panel 2. In the case of the mounting board 41c, the light emitting element EM and the observer are opposed to each other along the normal direction of the wiring board 42. In the case of the mounting boards 41a and 41e, the light emitting elements EM and the observer are not opposed to each other along the normal direction of the wiring board 42.

Thus, the intensity of light emitted from the mounting boards 41a and 41e toward the observer is lower than that of light emitted toward the normal direction of the wiring board 42. According to the second modification, however, the mounting board 41b is close to the mounting board 41a, and the mounting board 41d is close to the mounting board 41e. Light emitted from the mounting boards 41a and 41e toward the observer can thus be compensated.

The second modification can also bring about the same advantages as those of the first modification. In the second modification, the mounting board 41a corresponds to a first mounting board, the mounting board 41c corresponds to a second mounting board, and the mounting board 41b corresponds to a third mounting board.

Figure 13:
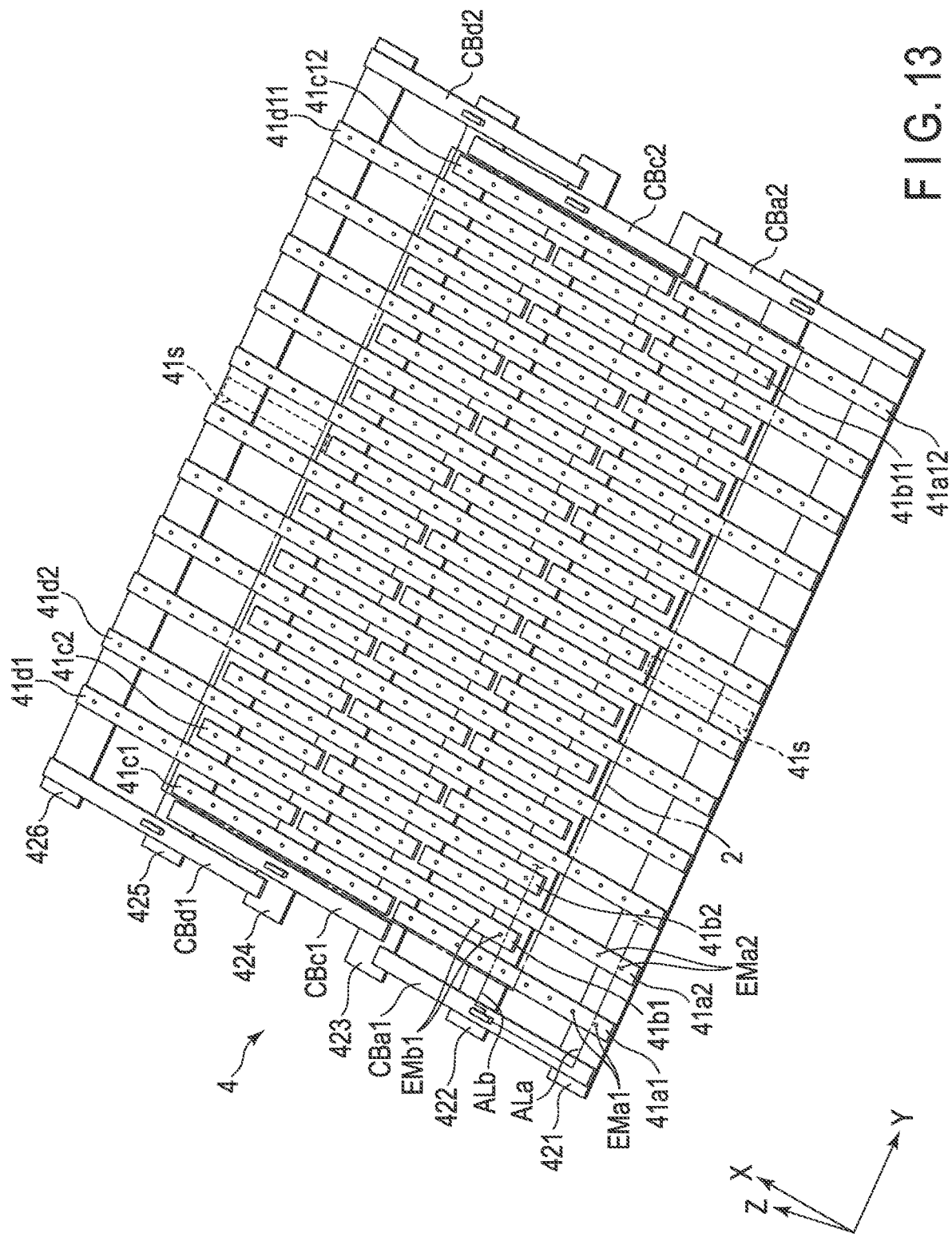
FIG. 13 is a perspective view showing a third modification to the illumination device 4.

FIG. 13 is a perspective view showing a third modification to the illumination device 4. The third modification differs from the example shown in FIG. 4 in that the mounting boards 41 are arranged in a hound's-tooth check pattern. In FIG. 13, the illumination device 4 includes six wiring boards 42 (421, 422, 423, 424, 425, 426). The wiring boards 42 have the same shape and are arranged at equal intervals along the first direction X. The mounting boards 41 also have the same shape and each include nine light emitting elements EM as shown in FIG. 13.

In the third modification, the mounting boards 41 are superposed on three wiring boards 42. That is, the mounting boards 41a (41a1, 41a2, . . . , 41a12) are superposed on the wiring boards 421, 422 and 423, not on the wiring boards 424, 425 and 426. The mounting boards 41b (41b1, 41b2, . . . , 41b11) are superposed on the wiring boards 422, 423 and 424, not on the wiring boards 421, 425 and 426. The mounting boards 41c (41c1, 41c2, . . . , 41c12) are superposed on the wiring boards 423, 424 and 425, not on the wiring boards 421, 422 and 426. The mounting board 41d (41d1, 41d2, . . . , 41d11) are superposed on the wiring boards 424, 425 and 426, not on the wiring boards 421, 422 and 423.

The mounting boards 41a, 41b, 41c and 41d are arranged at equal intervals along the second direction Y. In FIG. 13, in the second direction Y, the mounting board 41b1 is located between the mounting boards 41a1 and 41a2. The mounting board 41a2 is located between the mounting boards 41b1 and 41b2. In addition, the mounting boards 41a1 and 41c1, mounting boards 41b1 and 41d1, mounting boards 41a2 and 41c2, and mounting boards 41b2 and 41d2 are arranged along the first direction X.

The wiring board 421 includes a wiring line ALa. The wiring line ALa is electrically connected to the mounting board 41a. More specifically, the wiring line ALa is electrically connected to the anode electrode of the light emitting element EMa1 mounted on the mounting board 41a1 and the anode electrode of the light emitting element EMa2 mounted on the mounting board 41a2.

The wiring board 422 includes a wiring line ALa. The wiring line ALb is electrically connected to the mounting board 41a and also electrically connected to the mounting board 41b. More specifically, the wiring line ALb is electrically connected to the anode electrode of the light emitting element EMa1 and the anode electrode of the light emitting element EMa2, and is also electrically connected to the anode electrode of the light emitting element EMb1 mounted on the mounting board 41b1.

In FIG. 13, the illumination device 4 includes six connection boards CBa1, CBa2, CBc1, CBc2, CBd1 and CBd2. The connection boards CBa1 and CBa2 are located at both ends of each of the wiring boards 421, 422 and 423 in the second direction Y to overlap with the wiring boards 421, 422 and 423. In FIG. 13, the connection board CBa1 is adjacent to the mounting board 41a1, and the connection board CBa2 is adjacent to the mounting board 41a12. The connection boards CBc1 and CBc2 are located at both ends of each of the wiring boards 423, 424 and 425 in the second direction Y to overlap with the wiring boards 423, 424 and 425. In FIG. 13, the connection board CBc1 is adjacent to the mounting board 41c1, and the connection board CBc2 is adjacent to the mounting board 41c12. The connection boards CBd1 and CBd2 are located at both ends of each of the wiring boards 424, 425 and 426 in the second direction Y to overlap with the wiring boards 424, 425 and 426. In FIG. 13, the connection board CBd1 is adjacent to the connection board CBc1, and the connection board CBd2 is adjacent to the connection board CBc2. That is, the connection board CBc1 is located between the mounting board 41c1 and the connection board CBd1. The connection board CBc2 is located between the mounting board 41c12 and the connection board CBd2.

As indicated by an alternate long and short dash line in FIG. 13, the display panel 2 is, for example, disposed in an area where the mounting boards 41 are densely arranged. However, the area where the display panel 2 is disposed is not limited to the example shown in FIG. 13, but can be changed as appropriate. For example, the display panel 2 may be disposed in an area that overlaps with all of the mounting boards 41.

Note that the illumination device 4 may include mounting boards 41 of different sizes. For example, the illumination device 4 may include a mounting board 41s whose length along the first direction X is smaller than the length of each of the mounting boards 41a, 41b, 41c and 41d along the first direction X. This mounting board 41s may, for example, be disposed adjacent to the mounting board 41b on the opposite side of the mounting board 41d or may be disposed adjacent to the mounting board 41c on the opposite side of the mounting board 41a, as indicated by broken lines in FIG. 13.

The third modification can also bring about the same advantages as those of the example shown in FIG. 4 because the mounting boards 41 extending along the first direction X are arranged at intervals along the second direction Y and bonded to the wiring boards 42 whose rigidity is lower than that of the mounting boards 41. According to the third modification, furthermore, the mounting boards 41 are arranged in a hound's-tooth check pattern and thus the illumination device 4 can be enlarged in the first direction X as well as the second direction Y. In addition, the illumination device 4 is configured using the wiring boards 42 and mounting boards 41 of the same shape and thus its manufacturing costs can be decreased.

In the third modification, the mounting board 41a1 corresponds to a first mounting board, and the light emitting element EMa1 corresponds to a first light emitting element. The mounting board 41a2 corresponds to a second mounting board, and the light emitting element EMa2 corresponds to a second light emitting element. The mounting board 41b1 corresponds to a third mounting board, and the light emitting element EMb1 corresponds to a third light emitting element. The wiring board 421 corresponds to a first wiring board, and the wiring line ALa corresponds to a first wiring line. The wiring board 422 corresponds to a second wiring board, and the wiring line ALb corresponds to a second wiring line.

Figure 14:
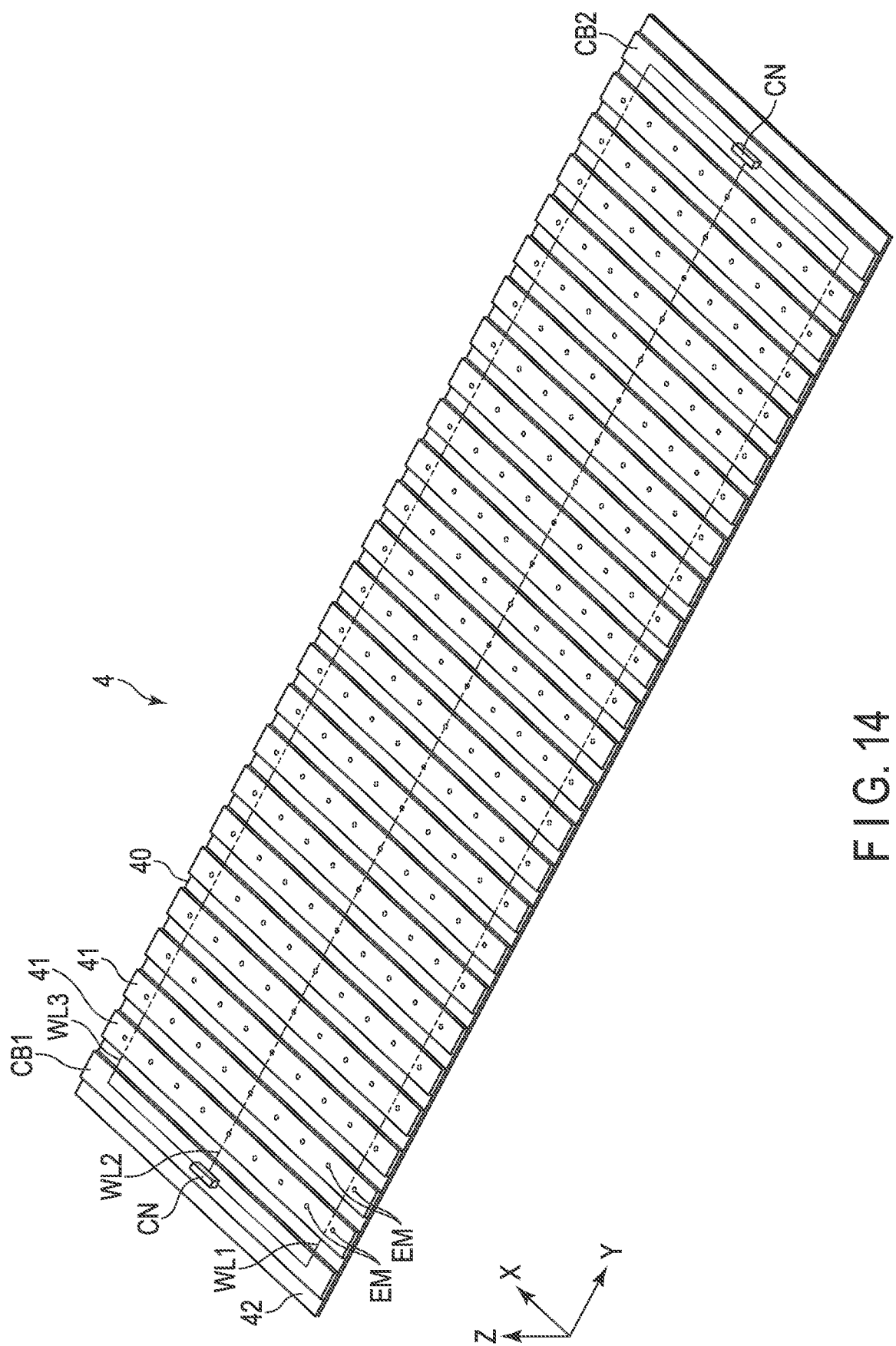
FIG. 14 is a perspective view showing a fourth modification to the illumination device 4.

FIG. 14 is a perspective view showing a fourth modification to the illumination device 4. The fourth modification differs from the example shown in FIG. 4 in that the illumination device 4 includes a single wiring board 42. All the mounting boards 41 are superposed on the wiring board 42. The wiring board 42 includes wiring lines WL1, WL2 and WL3 electrically connected to the light emitting elements EM. The fourth modification also brings about the same advantages as those of the example shown in FIG. 4 because the mounting boards 41 extending along the first direction X are arranged at intervals along the second direction Y and bonded to the wiring board 42 whose rigidity is lower than that of the mounting boards 41.

As described above, the first embodiment can provide an illumination device and a display device, which can easily be bent and can be prevented from degrading.

Second Embodiment

Figure 15:
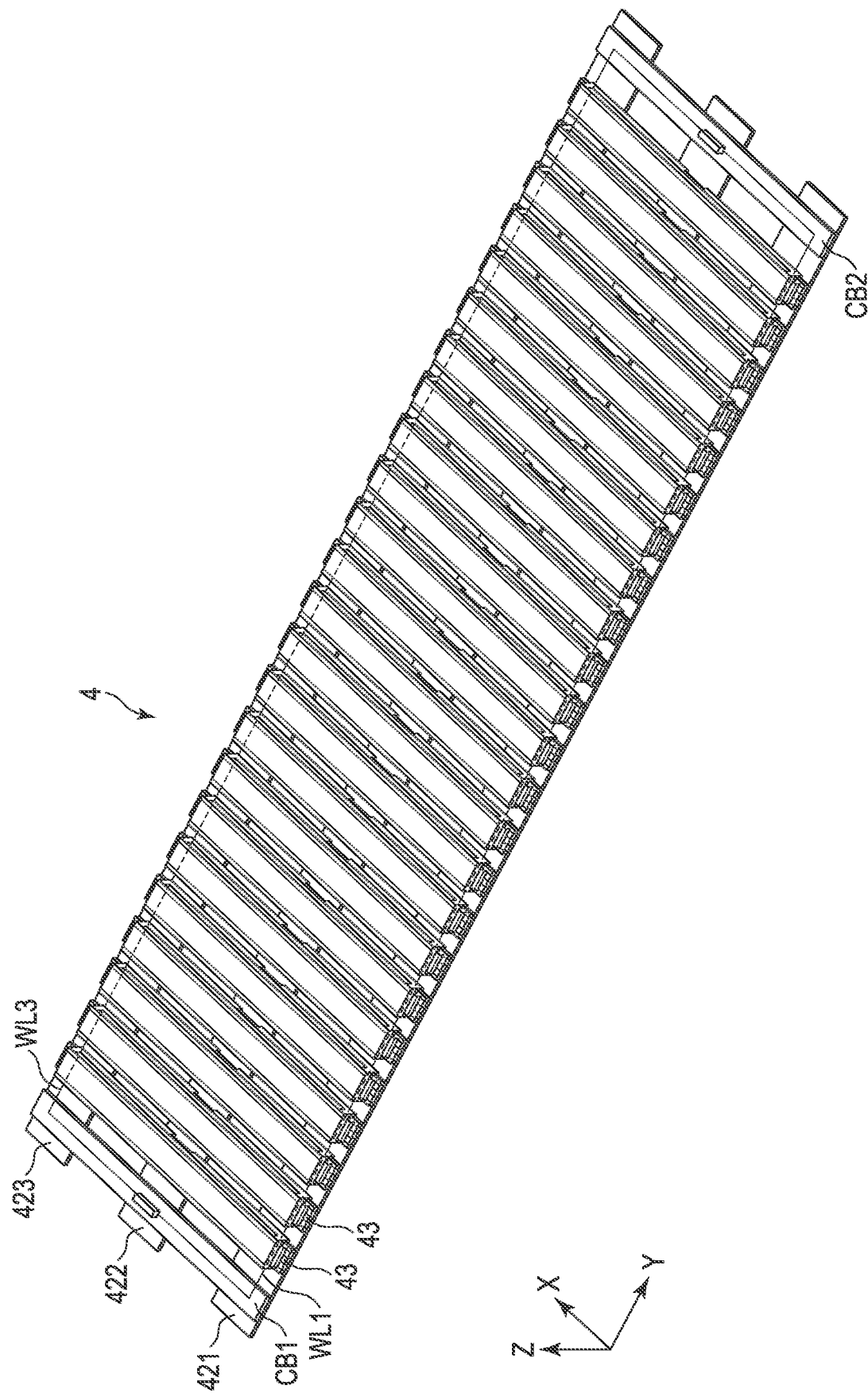
FIG. 15 is a perspective view showing an example of an illumination device 4 according to a second embodiment.

FIG. 15 is a perspective view showing an example of an illumination device 4 according to a second embodiment. The second embodiment differs from the first embodiment in that the illumination device 4 includes a plurality of light emitting units 43 in place of the mounting boards 41. The light emitting units 43 each extend along the first direction X and are arranged along the second direction Y. In the example shown, the light emitting units 43 are arranged at equal intervals. The light emitting units 43 emit light from their top surfaces, that is, the entire opposite surface of the surface facing the wiring boards 42. In the second embodiment, the rigidity of the wiring boards 421, 422 and 423 is lower than that of the light emitting units 43.

The wiring board 421 includes a wiring line WL1 overlapping one end of each of the light emitting units 43. The wiring board 423 includes a wiring line WL3 overlapping the other ends of the light emitting units 43. In the example shown, the wiring board 422 includes no wiring line. Like in the first embodiment, the light emitting units 43 and the wiring boards 421, 422 and 423 are bonded together by, for example, an anisotropic conductive film. Accordingly, the light emitting units 43 and the wiring line WL1 are electrically connected to each other via an anisotropic conductive film, as are the light emitting units 43 and the wiring line WL3. The wiring board 422 is brought into contact with the light emitting units 43 through an anisotropic conductive film and thus functions as a heat radiation plate that radiates heat generated from the light emitting units 43.

Figure 16:
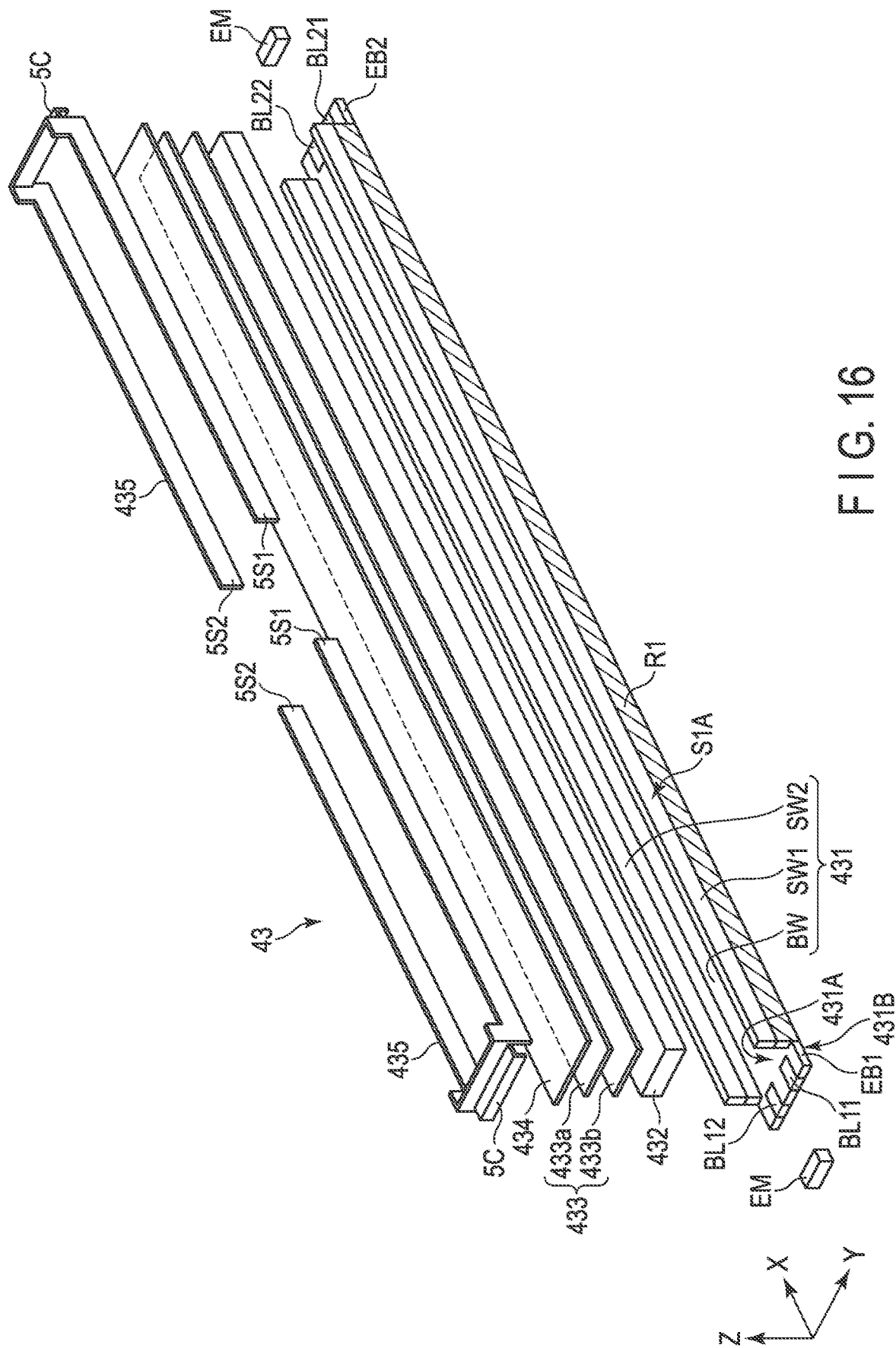
FIG. 16 is an exploded perspective view of a light emitting unit 43 shown in FIG. 15.

FIG. 16 is an exploded perspective view of one of the light emitting units 43 shown in FIG. 15. The light emitting unit 43 includes a holder 431, a light guide 432, an optical sheet 433 (433a, 433b), a light condensing sheet 434, a frame 435 (435a, 435b) and light emitting elements EM.

The holder 431 includes a bottom wall BW extending along the first direction X and a pair of side walls SW1 and SW2 opposed to each other. The bottom wall BW is shaped like a flat plate, and has a surface 431A opposed to the light guide 432 and an opposite surface of the surface 431A. In FIG. 16, the surfaces 431A and 431B are parallel to the X-Y plane. The side walls SW1 and SW2 are provided along the side edges of the bottom wall BW parallel to the first direction X. The sidewalls SW1 and SW2 are shaped like a flat plate and, for example, orthogonal to the bottom wall BW.

For example, the bottom wall BW and the side walls SW1 and SW2 are integrally injection-molded of resin. In FIG. 16, the side wall SW1 has a heat radiation film R1 on an opposite surface (fourth surface) S1A of the surface facing the side wall SW2. As hatched in FIG. 16, the heat radiation film R1 is formed in all the lower half of the surface S1A (i.e. alongside the bottom wall BW). The heat radiation film R1 is formed by plating a metal material such as copper. The same applies to the side wall SW2, though not shown. That is, the side wall SW2 has a heat radiation film in a lower half of the opposite surface of a surface facing the side wall SW1.

The length of the bottom wall BW along the first direction X is larger than the length of each of the side walls SW1 and SW2 along the first direction X. The bottom wall BW includes extended portions EB1 and EB2 extending outward from the side walls SW1 and SW2 at both ends in the first direction X. The extended portion EB1 includes, on the surface 431A, wiring lines BL11 and BL12. The extended portion EB2 includes, on the surface 431A, wiring lines BL21 and BL22. The wiring lines BL11, BL12, BL21 and BL22 are formed by plating a metal material such as copper.

The light emitting elements EM are, for example, LEDs. In FIG. 16, the light emitting unit 43 includes two light emitting elements EM. The light emitting elements EM are arranged in the extended portions EB1 and EB2, respectively. The anode electrode of the light emitting element EM arranged in the extended portion EB1 is electrically connected to, for example, the wiring line BL11, and the cathode electrode thereof is electrically connected to the wiring line BL12. The anode electrode of the light emitting element EM arranged in the extended portion EB2 is electrically connected to, for example, the wiring line BL21, and the cathode electrode thereof is electrically connected to the wiring line BL22.

The light guide 432 is, for example, a substantially rectangular parallelepiped extending along the first direction X. The light guide 432 is placed on the surface 431A of the bottom wall BW. The optical sheets 433a and 433b are disposed on the light guide plate 432, and the size of each of them is substantially equal to that of the top surface of the light guide 432. The optical sheet 433a is, for example, a prism sheet, and is placed on the optical sheet 433b. The optical sheet 433b is, for example, a diffusion sheet, and is disposed between the optical sheet 433a and the light guide 432. The length of each of the light guide 432 and optical sheet 433 along the first direction X is almost equal to the length of each of the side walls SW1 and SW2 along the first direction X.

The light condensing sheet 434 is placed on the optical sheet 433a. The light condensing sheet 434 condenses the light from the optical sheet 433 to the upper side (i.e., the opposite side of the optical sheet 433). The length of the light condensing sheet 434 along the first direction X is almost equal to the length of each of the side walls SW1 and SW2 along the first direction X. The length of the light condensing sheet 434 along the second direction Y is larger than that of each of the light guide 432 and optical sheet 433 along the second direction Y, and is almost equal to the width of the bottom wall BW along the second direction Y. The light condensing sheet 434 is thus supported by the side walls SW1 and SW2.

The frame 435 is formed of, for example, a metal such as aluminum. The frame 435 includes side walls 5S1 and 5S2 opposed to the side walls SW1 and SW2, and a cover 5C opposed to the light emitting elements EM.

Figure 17A:
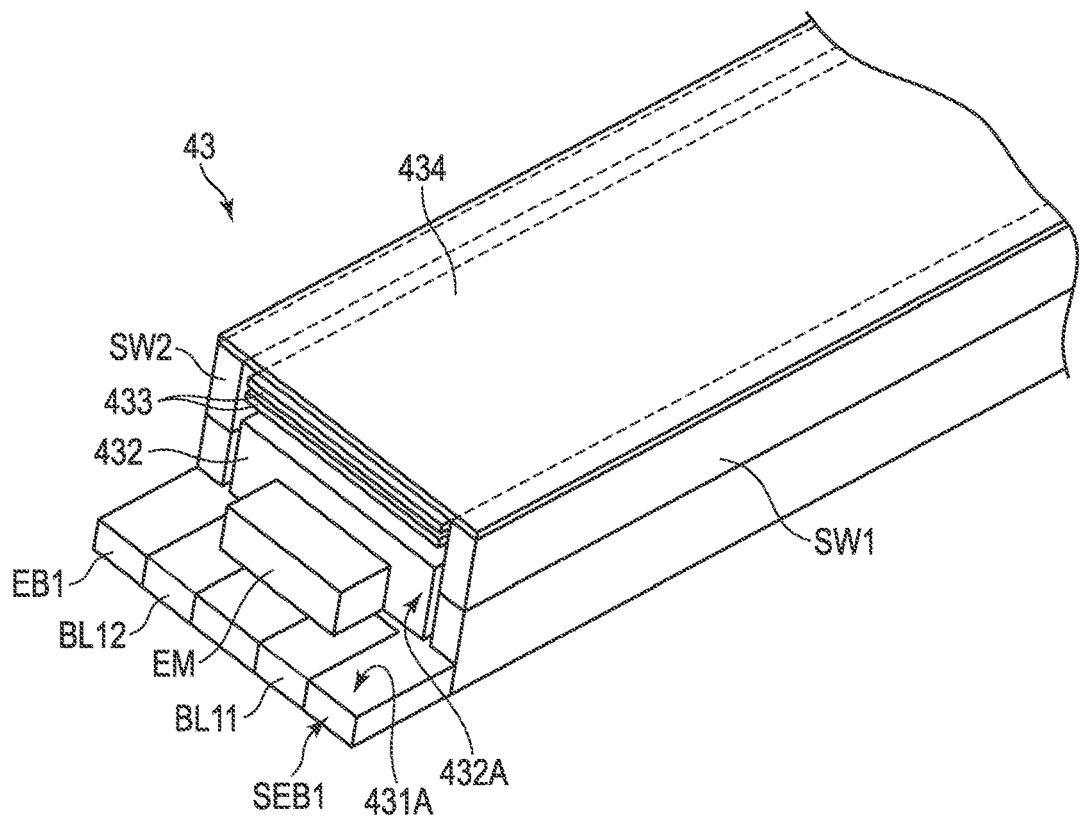
FIG. 17A is enlarged perspective view of the light emitting unit 43.
Figure 17B:
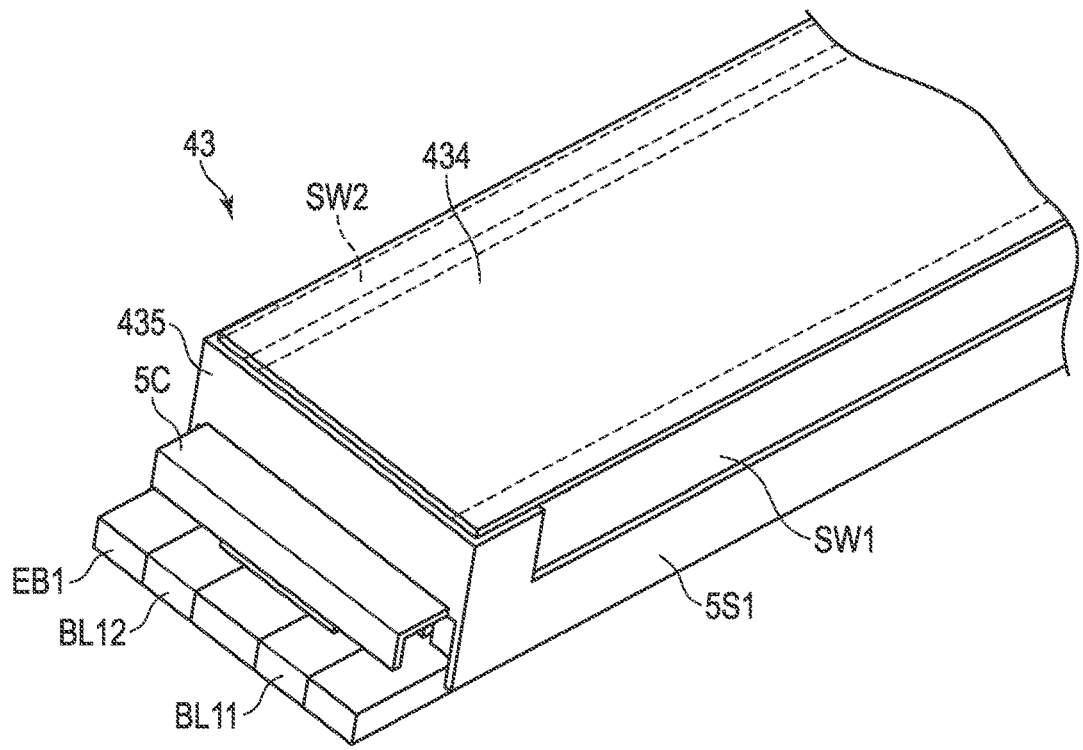
FIG. 17B is enlarged perspective view of the light emitting unit 43.

FIGS. 17A and 17B are enlarged perspective views of the light emitting unit 43, showing its extended portion EB1 side. Specifically, FIG. 17A shows the light emitting unit 43 in which the frame 435 shown in FIG. 16 has not yet fitted, and FIG. 17B shows the light emitting unit 43 in which the frame 435 is fitted.

As shown in FIG. 17A, the light guide 432 and optical sheet 433 are held in the holder 431. That is, the light guide 432 and optical sheet 433 are located between the side walls SW1 and SW2. The light emitting element EM is disposed in the extended portion EB1 and opposed to the side surface 432A of the light guide 432. The light condensing sheet 434 is disposed on the side walls SW1 and SW2. In the second embodiment, the light condensing sheet 434 serves as a lid of the holder 431. In other words, the light guide 432 and optical sheet 433 are held in a region surrounded by the light emitting element EM, holder 431 and light condensing sheet 434. The wiring lines BL11 and BL12 are formed on the surface 431A of the extended portion EB1 and also on the side surface SEB1 of the extended portion EB1.

As shown in FIG. 17B, the frame 435 covers the light emitting element EM and the side wall SW1. More specifically, the cover 5C of the frame 435 is in contact with at least the top surface of the light emitting element EM. The side wall 5S1 of the frame 435 is in contact with an area of the side wall SW1 where the heat radiation film R1 is provided. The same applies to the side wall SW2. Since the frame 435, which is made of a metal material, is in contact with the light emitting element EM and the heat radiation film R1, heat emitted from the light emitting element EM is conducted to the frame 435 directly or through the heat radiation film R1. Although not shown, the frame 435 and holder 431 are, for example, soldered to each other in the area where the heat radiation film R1 is provided.

Figure 18:
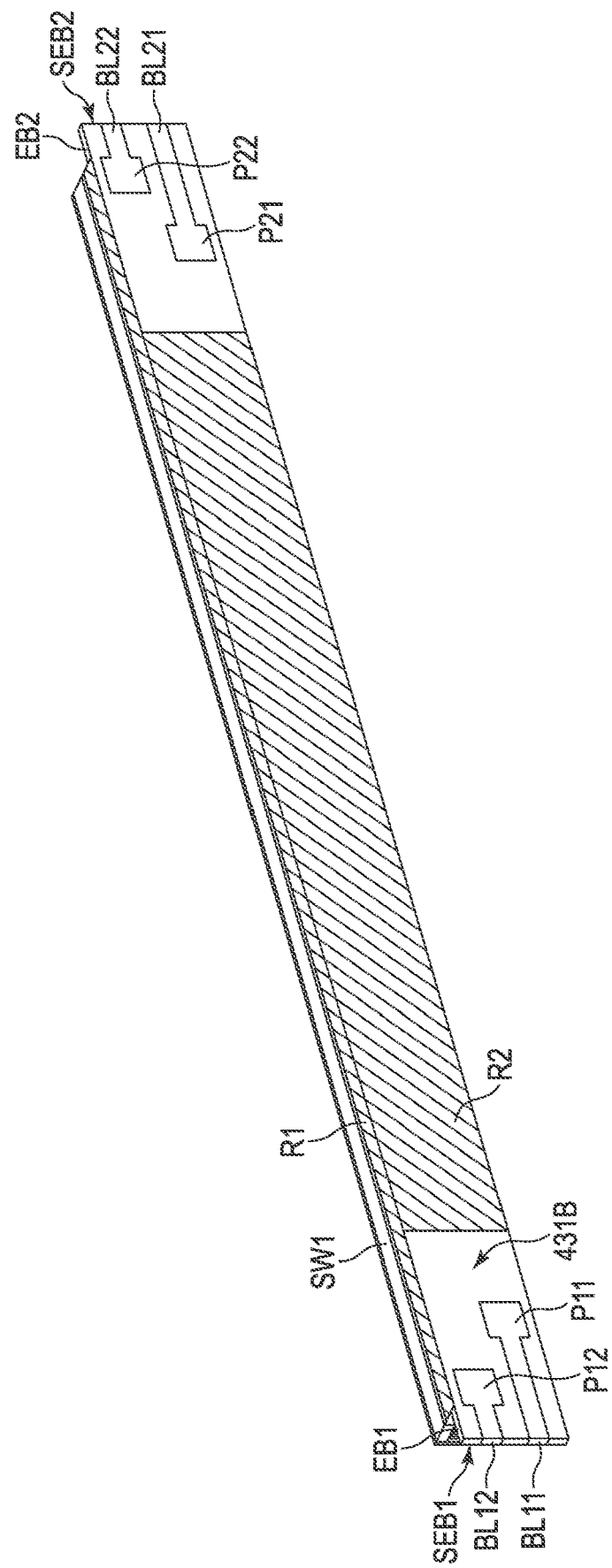
FIG. 18 is a view showing the surface 431B side of a bottom wall BW.

FIG. 18 is a view showing the surface 431B side of the bottom wall BW. The wiring lines BL11 and BL22 extend to the surface 431B through the side surface SEB1 of the extended portion EB1. On the surface 431B, pads P11 and P12 are formed at the ends of the wiring lines BL11 and BL12, respectively. In FIG. 18, the pad P11 is further away from the side surface SEB1 than the pad P12. The wiring lines BL21 and BL22 extend to surface 431B through the side surface SEB2 of the extended portion EB2. On the surface 431B, pads P21 and P22 are formed at the ends of the wiring lines BL21 and BL22, respectively. In FIG. 18, the pad P21 is further away from the side surface SEB2 than the pad P22.

The pad P11 is electrically connected to the wiring line WL1 included in the wiring board 421 through, for example, an anisotropic conductive film, and the pad P12 is electrically connected to another wiring line included in the wiring board 421 through, for example, an anisotropic conductive film. The pad P21 is electrically connected to the wiring line WL3 included in the wiring board 423 through, for example, an anisotropic conductive film, and the pad P22 is electrically connected to another wiring line included in the wiring board 423 through, for example, an anisotropic conductive film.

In FIG. 18, the surface 431B includes a heat radiation film R2. The heat radiation film R2 is formed in an area between the pads P11 and P21. That is, the heat radiation film R2 is separated from the wiring lines BL11, BL12, BL21 and BL22. The heat radiation film R2 is continuous with the heat radiation film R1 formed on the side wall SW1. Like the heat radiation film R1, the heat radiation film R2 is formed by plating a metal material such as copper.

Figure 19:
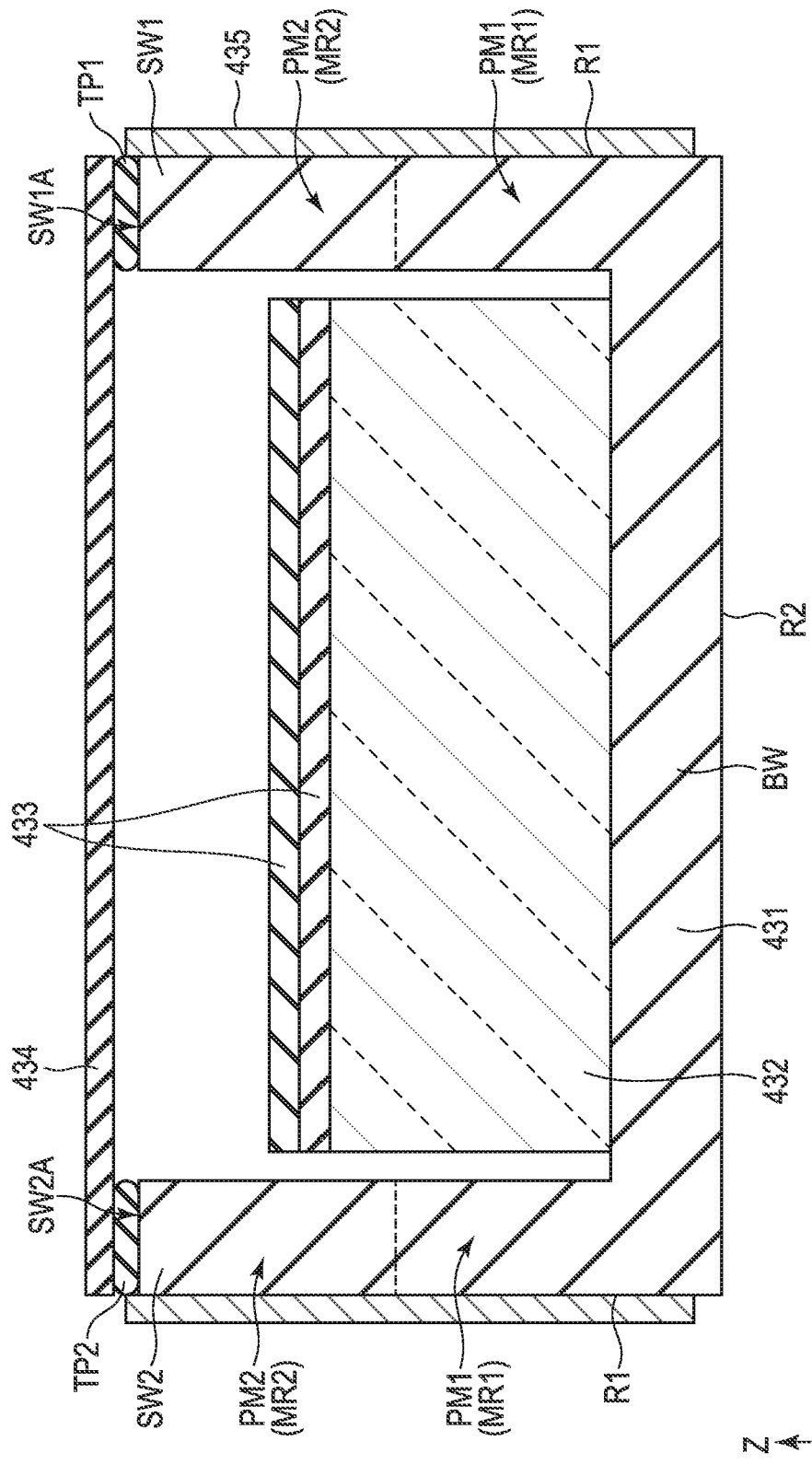
FIG. 19 is a sectional view of the light emitting unit 43.

FIG. 19 is a sectional view of the light emitting unit 43. The light condensing sheet 434 is bonded to the top surface SW1A of the side wall SW1 and the top surface SW2A of the side wall SW2. In FIG. 19, for example, double-faced tapes TP1 and TP2 are interposed between the light condensing sheet 434 and the top surface SW1A and between the light condensing sheet 434 and the top surface SW2A. Note that the light condensing sheet 434 and the side walls SW1 and SW2 may be bonded to each other by an adhesive.

In the second embodiment, the holder 431 is formed of two different resins. The bottom wall BW and first portions PM1 of the side walls SW1 and SW2 are formed of a first resin MR1. The first portions PM1 correspond to the lower sides of the side walls SW1 and SW2, that is, the half side that is in contact with the bottom wall BW. The second portions PM2 of the side walls SW1 and SW2 are formed of a second resin MR2. The second portions PM2 correspond to the upper sides of the side walls SW1 and SW2, that is, the half side that is separated from the bottom wall BW.

The rigidity of the first resin MR1 is higher than that of the second resin MR2. The light diffusivity of the second resin MR2 is higher than that of the first resin MR1. The second resin MR2 is, for example, an acrylic resin and a milk-white resin. Note that the rigidity of the wiring boards 421, 422 and 423 is smaller than that of at least the first resin MR1.

FIG. 20 is a diagram showing an example of a bent state of the display device 1 according to the second embodiment. The display device 1 is bent such that the end portions E21 and E22 of the display panel 2 are located below a middle part of the display surface 2A. That is, the display surface 2A is a convex surface. In addition, the illumination device 4 is bent along the display panel 2. More specifically, the wiring board 42 is bent along the display panel 2. It is assumed that an observer of the display device 1 observes the display device 1 from the front of the display panel 2.

The light incident on the light condensing sheet 434 from the light guide 432 is emitted toward the top surface of the light condensing sheet 434. That is, the light condensing sheet 434 emits light, which is substantially parallel to the normal direction of the wiring board 42, toward the display panel 2. As hatched in FIG. 20, the second portions PM2 of the side walls SW1 and SW2 have light diffusivity. The light incident on the second portions PM2 from the light guide 432 is thus emitted isotropically from the second portions PM2. Therefore, even when the illumination device 4 is bent as shown in FIG. 20, nonuniformity in luminance of the display device 1 can be reduced because light is emitted from the second portions PM2 toward an area between the light emitting units 43.

According to the second embodiment, the illumination device 4 is configured by two members having different rigidities. Specifically, the illumination device 4 is configured by the light emitting units 43 including light emitting elements EM and the wiring board 42 whose rigidity is lower than that of the light emitting units 43. The light emitting units 43 extend along the first direction X, arranged at intervals along the second direction Y, and bonded to the wiring board 42 extended along the second direction Y. In other words, the wiring board 42 includes an area superposed on the light emitting units 43 and an area not superposed on the light emitting units 43. The wiring board 42 not superposed on the mounting board 41 can easily be bent. Therefore, the illumination device 4 can easily be bent around the axis along the first direction X.

According to the second embodiment, the holder 431 of the light emitting units 43 is formed of two different resins. More specifically, in the holder 431, the bottom wall BW on which the light emitting elements EM and the light guide 432 are placed, are formed of the first resin MR1, as are the first portions PM1 of the side walls SW1 and SW2, which are in contact with the bottom wall BW. The second portions PM2 of the side walls SW1 and SW2, which are opposite sides of the bottom wall BW, are formed of the second resin MR2. The light diffusivity of the second resin MR2 is higher than that of the first resin MR1. Even when the illumination device 4 is bent, nonuniformity in luminance can be reduced and display quality can be improved because light is emitted isotropically from the second portions PM2 formed of the second resin MR2. The first resin MR1 has rigidity that is higher than those of the wiring board 42 and the second resin MR2, and is more greatly resistant to light than the second resin MR2. Since, therefore, the bottom wall BW is formed of the first resin MR1, the holder 431 can be prevented from degrading even when the light emitting elements EM are mounted.

Furthermore, according to the second embodiment, the holder 431 includes the heat radiation films R1 and R2 made of a metal material on the surface S1A of the side wall SW1 and the surface 431B of the bottom wall BW. The frame 435 made of a metal material is in contact with the heat radiation film R1 and the light emitting elements EM. In general, the thermal conductivity of a metal material is greater than that of resin. Since the heat emitted from the light emitting elements EM is transmitted to the frame 435 directly or through the heat radiation film R1, the holder 431 can be cooled effectively. Therefore, the light emitting units 43 can be prevented from being degraded by heat generated from the light emitting elements EM.

As described above, the second embodiment can provide an illumination device and a display device, which can easily be bent and which can be prevented from degrading.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An illumination device comprising:
a first mounting board including a plurality of first light emitting elements;
a second mounting board including a plurality of second light emitting elements; and
a first wiring board including a first wiring line electrically connected to at least one of the plurality of first light emitting elements and the plurality of second light emitting elements,
wherein:
the first mounting board and the second mounting board extend in a first direction and are arranged along a second direction intersecting the first direction; and
the first wiring board is superposed on the first mounting board and the second mounting board, and has rigidity that is lower than rigidity of each of the first mounting board and the second mounting board.

2. The illumination device of claim 1, wherein the first light emitting elements and the second light emitting elements are different in number.

3. The illumination device of claim 1, further comprising a third mounting board located between the first mounting board and the second mounting board and including a plurality of third light emitting elements,
wherein the first light emitting elements and the second light emitting elements are each larger in number than the third light emitting elements.

4. The illumination device of claim 1, further comprising a third mounting board located between the first mounting board and the second mounting board and including a plurality of third light emitting elements,
wherein:
the third mounting board is adjacent to each of the first mounting board and the second mounting board; and
an interval between the third mounting board and the first mounting board is different from an interval between the third mounting board and the second mounting board.

5. The illumination device of claim 1, further comprising:
a pad provided on the first mounting board and electrically connected to the first light emitting elements; and
an adhesive provided between the first mounting board and the first wiring board and including a conductive material
wherein:
the first mounting board has a first surface opposed to the first wiring board and a second surface that is an opposite side of the first surface;
the first wiring board has a third surface opposed to the first surface;
the pad is disposed on the first surface;
the first light emitting elements are disposed on the second surface;
the first wiring line is disposed on the third surface; and
the adhesive is in contact with the pad and the first wiring line.

6. The illumination device of claim 1, further comprising a second wiring board superposed on the first mounting board and the second mounting board and having rigidity that is lower than the rigidity of each of the first mounting board and the second mounting board,
wherein the first wiring board and the second wiring board extend in the second direction and are arranged along the first direction.

7. The illumination device of claim 6, further comprising a third mounting board located between the first mounting board and the second mounting board and including a plurality of third light emitting elements,
wherein:
the second wiring board includes a second wiring line electrically connected to the third light emitting elements; and
the third mounting board is superposed on the second wiring board and is not superposed on the first wiring board.

8. An illumination device comprising:
a first light emitting unit including a first light emitting element;
a second light emitting unit including a second light emitting element; and
a first wiring board including a first wiring line electrically connected to at least one of the first light emitting element and the second light emitting element,
wherein the first light emitting unit and the second light emitting unit extend in a first direction, are arranged along a second direction intersecting the first direction, and are bonded to the first wiring board; and
the first wiring board is superposed on the first light emitting unit and the second light emitting unit, and has rigidity that is lower than rigidity of each of the first light emitting unit and the second light emitting unit.

9. The illumination device of claim 8, wherein:
the first light emitting unit includes a holder extending in the first direction and a light guide held in the holder and opposed to the first light emitting element;

the holder has a bottom wall on which the light guide is placed, and a first side wall and a second side wall opposed to each other with the light guide therebetween; and at least the bottom wall is formed of a first resin whose rigidity is higher than rigidity of the first wiring board.

10. The illumination device of claim 9, wherein:

the bottom wall of the first side wall and the bottom wall of the second side wall are formed of the first resin;

an opposite side of the bottom wall of the first side wall and an opposite side of the bottom wall of the second side wall are formed of a second resin;

the first resin has rigidity that is higher than rigidity of the second resin; and the second resin has light diffusivity that is higher than light diffusivity of the first resin.

11. The illumination device of claim 9, wherein:

the first side wall has a fourth surface that is an opposite side of a surface opposed to the second side wall;

the bottom wall has a fifth surface that is an opposite side of a surface opposed to the light guide; and the fourth surface and the fifth surface are covered with a heat radiation film made of a metal material.

12. The illumination device of claim 9, wherein:

the first light emitting unit further includes a light condensing sheet opposed to the light guide; and the light condensing sheet is bonded to a top surface of the first side wall and a top surface of the second side wall.

13. A display device comprising:

an illumination device; and a display panel which selectively transmits light emitted from the illumination device, wherein the illumination device includes:

a first board including a plurality of first light emitting elements;

a second board including a plurality of second light emitting elements;

a first wiring board including a first wiring line electrically connected to at least one of the plurality of first light emitting elements and the plurality of second light emitting elements;

the first board and the second board extend in a first direction and are arranged along a second direction intersecting the first direction; and the first wiring board is superposed on the first board and the second board, and has rigidity that is lower than rigidity of each of the first board and the second board.

14. The display device of claim 13, wherein the illumination device and the display panel are bent around an axis parallel to the first direction.

\* \* \* \* \*